(12) United States Patent
Tøpholm

(10) Patent No.: US 6,920,414 B2
(45) Date of Patent: Jul. 19, 2005

(54) CAD/CAM SYSTEM FOR DESIGNING A HEARING AID

(75) Inventor: Jan Tøpholm, Holte (DK)

(73) Assignee: Widex A/S, Vaerloese (DK)

( * ) Notice: Subject to any disclaimer, the term of this patent is extended or adjusted under 35 U.S.C. 154(b) by 755 days.

(21) Appl. No.: 09/839,222

(22) Filed: Apr. 23, 2001

(65) Prior Publication Data

US 2002/0138237 A1 Sep. 26, 2002

(30) Foreign Application Priority Data

Mar. 26, 2001 (EP) ............................................ 01610032

(51) Int. Cl.⁷ ............................................ G06F 17/50
(52) U.S. Cl. ........................... 703/1; 700/163; 381/328; 29/896.21
(58) Field of Search ............................ 703/1; 700/163; 381/322, 328; 29/896.21

(56) References Cited

U.S. PATENT DOCUMENTS

| | | | |
|---|---|---|---|
| 5,056,204 A | 10/1991 | Bartschi | 29/896.21 |
| 5,121,333 A | * 6/1992 | Riley et al. | 700/163 |
| 5,487,012 A | 1/1996 | Topholm et al. | 700/163 |
| 5,889,874 A | 3/1999 | Schmitt et al. | 381/328 |
| 6,052,473 A | 4/2000 | Clavadetscher et al. | 381/322 |
| 6,167,141 A | 12/2000 | Yoest | 381/322 |

FOREIGN PATENT DOCUMENTS

| | | |
|---|---|---|
| BE | 1 010 200 A3 | 3/1998 |
| JP | 62-32800 | 2/1997 |
| JP | 11-055797 | 2/1999 |
| WO | WO 98/47319 | 10/1998 |
| WO | WO 00/03561 | 1/2000 |
| WO | WO 00/34739 | 6/2000 |
| WO | WO 01/05207 A2 | 1/2001 |

* cited by examiner

*Primary Examiner*—Russell Frejd
(74) *Attorney, Agent, or Firm*—Sughrue Mion, PLLC

(57) ABSTRACT

The present invention relates to a CAD/CAM system for design and manufacture of a hearing aid housing comprising a face plate and a shell that is matched to the auditory canal of a user, the system being adapted to receive and process data representing the shape of the auditory canal, forming a three-dimensional model of the shell based on the data, and outputting data representing the model for production of the shell and the face plate based on the model. Manufacture of the face plate includes at least one automatic processing step based on data from a CAD/CAM model of the hearing aid housing. For example, data relating to the circumference of the face plate may be provided to a numerically controlled machine that automatically cuts a separately manufactured face plate along the desired contour that matches the circumference of the corresponding shell. In another embodiment, the hearing aid housing is manufactured with an integrated face plate.

53 Claims, 19 Drawing Sheets

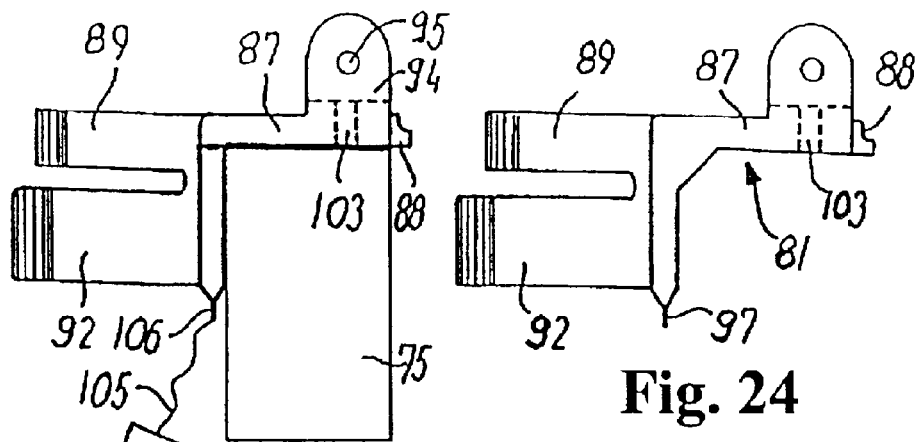
Fig. 23
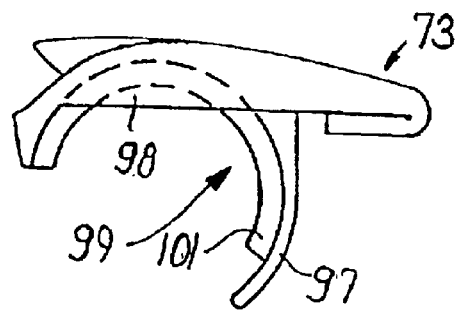
Fig. 25
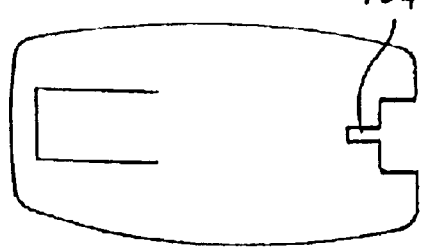
Fig. 26
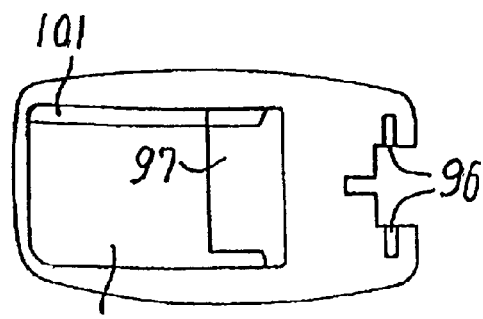
Fig. 27
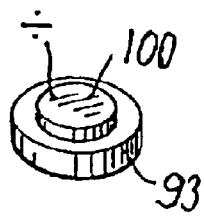
Fig. 28

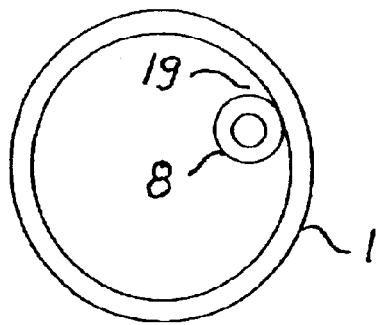 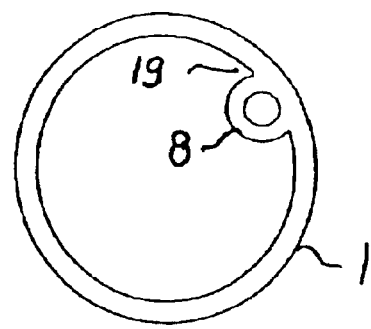
(a)　　　　　　　　　　(b)
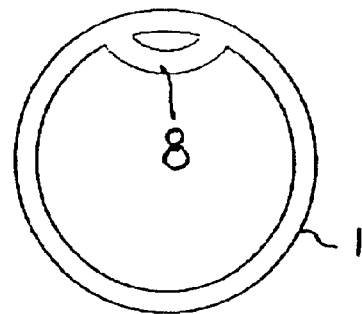 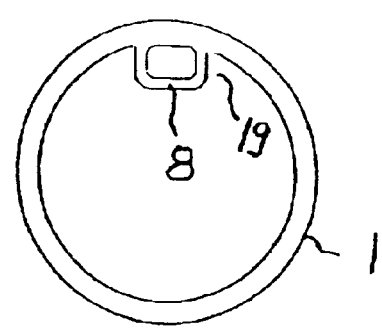
(c)　　　　　　　　　　(d)
Fig. 31

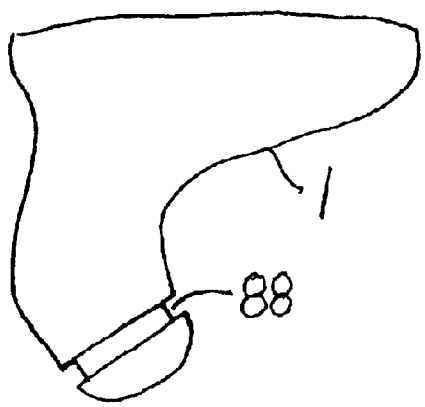 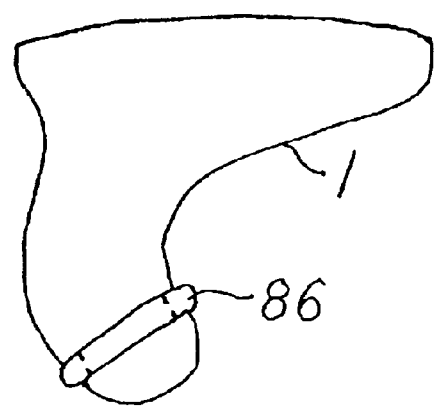
(a) (b)
Fig. 32

CAD/CAM SYSTEM FOR DESIGNING A HEARING AID

FIELD OF THE INVENTION

The present invention relates to manufacturing of a hearing aid housing that is individually matched to the shape of the auditory canal of a user.

BACKGROUND OF THE INVENTION

In U.S. Pat. No. 5,487,012, a method is disclosed for manufacturing of a hearing aid housing comprising a hearing aid shell with an opening, and a face plate for covering the opening. The shell is individually matched to the shape of the auditory canal of a user. The method comprises the steps of a) direct or indirect acquisition of the shape of the auditory canal to obtain digital data representing the shape, b) conversion of the digital representation of the shape into a multi-dimensional computer model of the outer shape of the matching shell, and c) computer controlled production of the shell based on the data obtained from the three-dimensional computer model of the shell.

Problems relating to manufacture of the face plate are not recognized in U.S. Pat. No. 5,487,012.

SUMMARY OF THE INVENTION

It is an object of the present invention to provide further improvements of the above-mentioned method for manufacturing of a hearing aid housing, e.g. improvements related to automation of the manufacture of the face plate.

Thus, it is an object of the present invention to further automate production of individually matched housings of in-the-ear hearing aids.

It is another object of the present invention to facilitate optimum utilization of the space available in the auditory canal and in the outer ear thereby minimizing the size of the hearing aid.

It is a further object of the present invention to provide a hearing aid with a cosmetic attractive appearance.

According to the present invention, the above-mentioned and other objects are fulfilled by a system and a method wherein a) the shape of the auditory canal is acquired and represented by digital data, b) the digital data are converted to a three dimensional computer model of a hearing aid shell that is matched to the shape of the auditory canal, c) positions and shapes of various features of the hearing aid housing, such as junction contour, i.e. the contour of the junction between shell and face plate, vent channel openings, sound input and output openings, battery opening, stubs, bushings, etc, are selected and models of the respective features are included in the shell model, d) a model of a face plate having engaging means for receiving and holding a hearing aid component and mating the shell model is formed and combined with the shell model to form a hearing aid housing model, and wherein e) computer controlled production of a hearing aid housing including the face plate is performed based on the housing model.

Thus, according to the invention manufacturing of the face plate includes at least one automatic processing step based on data from the model of the hearing aid housing whereby the face plate is automatically manufactured to fit the hearing aid shell. For example, junction contour data may be provided to a numerically controlled machine that automatically cuts a separately manufactured face plate along a contour that matches the junction contour.

Various methods of determining or acquiring the shape of a body, such as an ear impression, are well-known in the art. Determination of position of a point on a surface of an object may be performed by moving a mechanical device into contact with the point and reading the position of the mechanical device, e.g. using a co-ordinate measuring machine having scales on moving parts.

In non-contact measurements, positions of points on the surface of an object may be determined by transmitting one or more beams of radiated energy towards the object and detecting radiated energy that has interacted with arbitrary parts of the object.

The radiated energy may be of any form, such as ultrasound radiation, sound radiation, electromagnetic radiation of any frequency, such as radiation of X-rays, gamma rays, ultraviolet light, visible light, infrared light, far infrared radiation, UHF radiation, HF radiation, etc, particle radiation, such as radiation of electrons, neutrons, alpha-particles, etc, etc.

The object, the shape of which is to be determined, may interact with the radiated energy by reflecting, refracting, diffracting or absorbing energy or by any combination hereof.

For example, a laser may emit a linear light beam towards the object under measurement, and a video camera with a CCD chip may be utilized to detect light diffusely reflected from the surface of the object. Then, positions of points of the surface of the object reflecting the light beam are determined by triangulation methods. The beam is swept across the surface of the object e.g. by a movable mirror.

The shape of an object may also be determined with a plurality of electronic cameras. The object is then illuminated by a set of incoherent light sources, such as light bulbs, emitting substantially white light in all directions. A plurality of cameras with known positions in relation to each other are used to determine positions of points of the surfaces of the object by triangulation methods.

When the shape of the auditory canal is acquired by scanning of the canal itself, dynamic recording of the auditory canal may be performed. Since the shape of the auditory canal changes as a result of speaking, eating, drinking etc, this method of acquiring the shape of the auditory canal provides data which vary in time whereby such shape changes can also be taken into consideration during manufacture of the corresponding hearing aid housing.

Alternatively, a plurality of impressions may be made of the auditory canal with the jaw in various respective positions in order to accommodate shape changes of the auditory canal. For example, two impressions may be made namely one with closed mouth and one with open mouth.

Having acquired digital data representing the shape of the auditory canal and a part of the outer ear, these data may be further manipulated according to well-known methods of CAD/CAM systems to design and produce a hearing aid housing, e.g. including forming a three-dimensional model of the shape of the hearing aid shell. Further, the model may be displayed on a computer screen in various three-dimensional views and two-dimensional cross-sections, and various automatic and operator controlled functions, including the functions described herein, for adjustment of the model may be provided by a CAD/CAM system.

Thus, according to the present invention, a CAD/CAM system is provided for design and manufacture of a hearing aid housing with a face plate and a shell that is matched to the auditory canal of a user, comprising a processor that is adapted to receive and process data representing the shape of the auditory canal, forming a three-dimensional model of the shell based on the data, and outputting data representing the model for production of the shell and the face plate based on the model.

Two identical models may be formed from the acquired digital data, i.e. a model of the auditory canal including a part of the outer ear, and a model of the hearing aid shell. The model of the auditory canal remains unchanged while the model of the hearing aid shell may be subject to modifications and additions of various features as will be described below. The models may be displayed in distinguishable colors, and the shell may be displayed inserted in the auditory canal. For this and other purposes, the model of the auditory canal may be displayed transparently.

Upon formation of the three-dimensional model of the hearing aid shell, a contour encircling the shell may be selected for definition of a junction between the hearing aid shell and the face plate, and data representing the selected junction contour may be determined. Preferably, the junction contour is a plane contour.

According to the invention, the shell is produced based on the model and may be terminated with an outward opening defined by the junction contour.

In one embodiment of the invention the junction contour data are transferred to a numerically controlled machine that automatically cuts a separately manufactured face plate along a contour that matches the junction contour. As mentioned above, the junction contour may be a plane contour compatible with a plane face plate.

The face plate may comprise positioning means for engaging with corresponding positioning means of the shell so that the circumference of the face plate matches the junction contour of the shell when the face plate positioning means engage with the shell positioning means.

In a preferred embodiment, the face plate positioning means comprise at least one face plate protrusion at the inner surface of the face plate, and the shell positioning means comprise indentations that are adapted to receive and match the at least one face plate protrusion. The face plate is cut along the junction contour so that it matches the junction contour when the at least one face plate protrusion are received by the mating indentations of the shell whereby correct assembly of the face plate and the shell is facilitated.

In another embodiment, the face plate positioning means comprise at least one face plate protrusion at the inner surface of the face plate terminating at the circumference of the face plate at a distance from the circumference that is substantially equal to the thickness of the shell at the junction contour. The shell positioning means comprise the shell at the junction contour. The face plate is cut along the junction contour so that it matches the junction contour when the ends of the at least one face plate protrusion abut the corresponding part of the inner surface of the shell. The shell positioning means may further comprise protrusions at the junction contour extending inwardly towards the interior of the shell for reception and holding corresponding face plate protrusions.

Shape, dimensions, and position of a battery opening in the face plate facilitating insertion and removal of a battery may be selected and included in the face plate model. Based on the model, the opening may be provided automatically during production utilizing a numerically controlled working machine.

In a similar way, at least one microphone opening may be provided in the face plate.

In another embodiment of the present invention, the hearing aid housing is manufactured with an integrated face plate.

The integrated face plate is defined as a part of the surface of the hearing aid housing that does not match the shape of the auditory canal of the user; rather, it defines a termination of the hearing aid housing facing the surroundings of the user when the hearing aid housing is inserted in the auditory canal.

Obviously, the face plate is integrated when at least a part of the face plate and the shell are produced together as one unit. For example, the face plate is said to be integrated when the joining of the face plate to the shell along the junction contour is produced together with the shell, i.e. during production of the shell the joining of the face plate to the shell is inherently performed.

According to a preferred embodiment of the invention, a three-dimensional model of the face plate is formed that matches the selected junction contour, and the face plate model and the shell model are combined into one three-dimensional model of the hearing aid housing. Based on the combined model, a hearing aid housing with an integrated face plate is produced, e.g. utilizing a rapid prototyping technique, such as stereolithography, laser sintering, fused deposition modeling, drop deposition printing (resembles ink jet printing), etc.

As mentioned above for the non-integrated face plate, shape, dimensions, and position of an opening in the integrated face plate facilitating insertion and removal of a battery may be selected and included in the face plate model that is further included in the housing model.

In a similar way, at least one microphone opening may be provided in the integrated face plate.

Directional characteristics of two microphones positioned at a first and a second microphone opening, respectively, of the at least on microphone openings may be calculated, and first and second positions of the respective first and second microphone openings may be selected that correspond to a desired directional characteristic. The calculations may include the shape of the outer ear, e.g. as determined during determination of the shape of the corresponding auditory canal.

The face plate may have engaging means for receiving and holding a hearing aid component, and a model of the engaging means may be included in the face plate model that in turn is included in the hearing aid housing model so that the integrated face plate may be manufactured with the engaging means, e.g. using a rapid prototyping technique.

In one embodiment of the invention, a face plate is separately manufactured including a battery opening. The separately manufactured plate may also comprise the engaging means. Then, the shell of the hearing aid housing is produced attached to or abutting the plate, e.g. using a rapid prototyping technique, layer by layer, the first layer or cross-section of the shell surrounding the battery opening along the previously selected junction contour of the hearing aid housing.

In another embodiment of the invention, only a part of the face plate including the battery opening is separately manufactured. The circumference of the part is included in the hearing aid housing model, and the hearing aid housing is produced with an integrated face plate attached to or abutting the separately manufactured part layer by layer, the first layer abutting the circumference of the part. Alternatively, the shell may be formed starting with the end opposing the face plate and when the integrated face plate has been formed terminating with an opening having a circumference matching the circumference of the separately produced part of the face plate, the part is positioned in the opening and fitted and attached to the opening.

Further, one or more hearing aid housings may be manufactured in parallel in a batch utilizing rapid prototyping techniques. For example, a batch plate may be separately manufactured including a plurality of battery openings corresponding to a plurality of hearing aid housings. The batch plate may also comprise engaging means of the hearing aid housings. Then, at each of the battery openings a shell is formed, the first layer surrounding the respective battery opening along the junction contour of the respective hearing aid housing. In another example, a plurality of the above-mentioned separately manufactured part of the face plate are positioned in a rapid prototyping apparatus for parallel manufacture of a plurality of hearing aid housings in a batch. A fixture may be provided in the prototyping apparatus with positioning means for accurately receiving and holding the parts in precisely known positions. Each of the parts may be provided with corresponding positioning means that match the positioning means of the fixture.

The separately manufactured face plate or part of the face plate or batch plate may contain parts of metal, such as springs, elastically resilient lugs, electrical terminals, etc.

The hearing aid may be a modular hearing aid comprising a hearing aid housing and an electronic module with a socket, at least one microphone, a signal processor, and a receiver enclosed in the hearing aid housing. The hearing aid housing comprises a face plate having a battery opening defined therein for passage of a battery and the electronic module. Further, the hearing aid housing comprises engaging means for receiving and removably holding the socket. It is an important advantage of the modular hearing aid that the electronic module may be removed from the hearing aid without damaging the hearing aid housing.

The engaging means may comprise grooves, tracks and/or notches for engagement with cooperating socket engaging means formed on the socket.

The socket engaging means may comprise elastically resilient lugs.

The lugs may be integrated with battery terminals projecting from the socket.

Shape, dimension, and position of an acoustic output opening in the hearing aid shell for transmission of sound from the hearing aid towards the tympanic membrane may be selected and included in the shell model.

Displaying the model of the hearing aid housing inserted in the auditory canal model may facilitate selection of a position of the acoustic output opening so that the output opening emits sound in the direction of a longitudinal axis of the auditory canal thus, minimizing the risk of the output opening emitting sound towards a wall of the auditory canal or even being partially or entirely occluded by an auditory canal wall.

Preferably, the hearing aid housing is produced with an integrated ventilation channel. Upon formation of a three-dimensional model of the hearing aid housing, the model including or excluding the face plate, a path may be selected along which the ventilation channel is intended to extend. The ventilation channel may constitute a tube with a uniform or non-uniform cross-section along the length of the channel. The cross-section of the ventilation channel may be of any form, such as a circular, square, rectangular, rectangular with round corners, etc. The shape and dimensions of the ventilation channel cross-section and of the ventilation channel walls may be specified manually, e.g. as is well-known from CAD/CAM systems, and may vary along the length of the channel. The shell wall may constitute a part of the wall of the ventilation channel. Data representing the opening of the ventilation channel in the hearing aid shell opposite the face plate are calculated, and the shell may be automatically produced with the ventilation channel opening. Further, the position and the geometry of the ventilation channel opening in the face plate may be automatically calculated facilitating automatic production of the face plate with the ventilation channel opening.

As for the acoustic output opening, displaying the model of the hearing aid housing inserted in the auditory canal model may facilitate selection of a position of the shell ventilation channel opening so that it points in the direction of a longitudinal axis of the auditory canal thus, minimizing the risk of the ventilation channel output opening being partially or entirely occluded by an auditory canal wall.

Either or both of the acoustic output opening and the ventilation channel opening may be adapted to receive and hold an ear wax guard. The openings and the ear wax guard may be of the types disclosed in WO 00/03561. A pipe stub may be formed in the produced shell extending inwardly in the shell and forming a bushing for insertion of the ear wax guard. A recess may be formed in the shell covering an area around the opening and matching a collar of the ear wax guard or, matching a collar of a bushing to be inserted in the opening for receiving and holding the ear wax guard. Preferably, wall thickness is maintained at the recess to avoid formation of a weak area of the shell.

The shell may be produced with a means for vibration absorbing suspension of the receiver. For example, the shell may comprise strap holders for receiving and holding resilient straps that in turn hold or clutch the receiver providing vibration absorbing suspension of the receiver. In another embodiment, the shell comprises a chamber or protrusions for receiving and holding the receiver, and at least one resilient band fixed around the receiver and having protrusions for supporting and suspending the receiver in the chamber.

The outer dimensions of the hearing aid shell model may be selectively increased so that the corresponding hearing aid shell exerts a pressure on the auditory canal tissue when the shell is inserted in the auditory canal. The outer dimensions may be uniformly increased over the entire surface of the shell, or the size increase may be reduced gradually along a longitudinal axis of the shell so that very little or no pressure is exerted on tissue residing deeply in the auditory canal. Alternatively or additionally, the outer dimensions may be increased at selected areas of the shell surface, e.g. forming a rib partly or fully encircling the hearing aid shell, the rib providing a tight seal against the auditory canal wall when the shell is inserted in the auditory canal.

Further, a tightening contour may be selected that extends along the surface of the shell and partly or fully encircles the shell. A groove extending along the contour may be included in the model having a cross-section with a shape and dimensions that match a desired tightening ring to be mounted in the produced shell, or alternatively, that is adapted for automatic deposition of a material different from the material of the shell, the deposited material constituting a tightening protrusion. The tightening protrusion or the tightening ring provides an appropriate and secure tightening of the shell to the auditory canal when the shell is mounted in the auditory canal. If the hearing aid does not provide a good seal when inserted in the auditory canal, feedback generating oscillations usually occurs and the gain has to be decreased and thus, the full capabilities of the hearing aid can not be utilized. Further, the shape of the auditory canal typically changes in response to user activity, such as chewing, yawning, etc. A rigid hearing aid shell may not be capable of adjusting to changes in auditory canal shape due to movements of the jaw and thus, a shell that is perfectly fitted initially may produce unsatisfactory results in normal use. A flexible tightening ring solves this problem.

In an embodiment wherein the shape of the auditory canal has been determined dynamically, the tightening contour is preferably selected at positions corresponding to positions in the auditory canal at which the above-mentioned dynamic variations of the dimensions of the auditory canal exhibit small variations whereby a secure and tight mounting of the shell in the auditory canal is provided independent of user activity.

Three-dimensional models of shapes and geometries of various hearing aid components, such as microphones, signal processors, output transducers, etc, may be stored in a database, and may be selected for incorporation into the hearing aid. Utilizing well-known CAD/CAM methods, models of the selected components may be positioned and displayed within the hearing aid housing model and may be moved around for selection of respective optimum positions and orientations, e.g. for provision of a hearing aid of a minimum size. Collision checks may be performed, and positions of the features of the hearing aid shell, e.g. the vent channel, may also be moved around to further optimize positioning of the hearing aid components.

Although there may be sufficient room for a specific component at a certain position within the shell, it may not be possible to move the component into that position, e.g. because the internal volume of the shell forms a bottle neck at the input opening. Thus, during design of the hearing aid, collision check may also be performed during movement of the component in question through the input opening into the shell along a desired path towards the desired mounting position.

The shape of the shell may be adjusted selectively in order to increase the internal volume of the shell for provision of sufficient space for a specific component. Preferably, the outer volume of the shell is increased at areas corresponding to ear locations that are relatively non-sensitive to pressure.

The selection of the path of the junction contour may be performed while the shell model is displayed as inserted in the auditory canal. In this way, the position of the face plate covering the shell outward opening may be selected for optimum cosmetic appearance when the hearing aid is inserted in the auditory canal. It should be noted that a model of a part of the outer ear should be included in the model of auditory canal facilitating evaluation of the cosmetic appearance of the hearing aid. Typically, an impression of an auditory canal also contains an impression of a part of the outer ear.

The surface of the shell model may be smoothed to eliminate sharp edges and corners and to obtain a smooth surface. The entire shell may be smoothed or specific areas of the shell may be selected, e.g. using a computer mouse with a cursor, for smoothing by well known CAD/CAM smoothing techniques.

For example, presence of cerumen or fall off tissue in the auditory canal when the impression of the auditory canal is made may create undesired artifacts in the shell model. An artifact may be removed from the hearing aid housing model by deleting the surface covered by the artifact from the model and calculating a new surface substituting the deleted surface based on the model surface surrounding the artifact.

Further, a serial number or another identification of the produced hearing aid housing may be incorporated into the housing model, e.g. in a selected position, so that the housing may be produced with an inherent identification.

The finished hearing aid housing model may be stored in a database for later retrieval.

The database may be utilized for further automation of the design process. For example, the acquired data representing the shape of an auditory canal may be compared to the shape of housing models stored in the data base, and the best match may be retrieved and the positions of features of the hearing aid housing and selections, positions, and orientations of hearing aid components may automatically be reused in the hearing aid housing to be designed. An operator may subsequently adjust or change the retrieved positions, orientations and selections. The comparison may be performed solely for selected corresponding areas of the hearing aid housings. The models may be stored in the database in a reduced form requiring a reduced amount of data, since the very high mechanical tolerances required for production of hearing aid housings are not required for comparisons of shape with the purpose of reusing positions, orientations, selections, features, or components relating to the stored hearing aid housing models.

A patient database may be formed comprising records with a patient identifier, e.g. name and number, holding the hearing aid housing model of the patient in question. The records may further hold respective models of the original impression of the auditory canal of the patient, and identifiers and models of the hearing aid components used in the patient's hearing aid, etc. A new hearing aid for a specific user may then be produced without having to acquire the shape of the auditory canal again, e.g. by making a new impression of the auditory canal, since the previously acquired shapes may be easily retrieved from the patient database.

It is well-known in the art to produce a housing based on a three-dimensional computer model of the housing utilizing so-called rapid prototyping techniques, such as stereolithography, laser sintering, fused deposition modeling, drop deposition printing, etc.

For example, in stereolithography, the computer model is converted into a number of cross-sections that may be equidistant, plane-parallel and horizontal, but need not be. Then, the housing is manufactured by producing the individual cross-sectional planes successively and on top of each other, underneath each other or next to each other and joining them together. A container with activated liquid synthetic resin may be located on a computer controlled movable platform. By targeted use of radiation directed at the surface of the liquid synthetic resin and causing at least part-polymerization of the synthetic resin, it is possible to generate a first cross-section of the hearing aid housing. After completion of each cross-section, the platform is lowered by the layer thickness so that the next cross-sectional plane on the surface of the liquid synthetic resin can be produced in the same way. This continues until the polymerized housing can be removed from the container.

Laser sintering is another layered fabrication process producing a three-dimensional object from powdered materials in a layered fashion utilizing heat generated by a $CO_2$ laser. As in stereolithography, the computer model is converted into a number of cross-sections successively produced by applying the laser beam to a thin layer of powder.

The laser beam fuses the powder particles to form a thin layer of solid mass. The laser sintering process allows for the use of a variety of powdered materials.

A further possibility is to produce the cross-sections with a printing method similar to that used in an ink-jet printer, i.e. a drop deposition printing, for example, by consecutively producing successive cross-sections using the drop depositioning printing and, after at least partial polymerization which should already take place at the printing operation, by then stacking them on top of each other and joining them to form a shell.

It is an important advantage of the present invention that a hearing aid housing that is matched to a specific auditory canal and that includes various features, e.g. an integrated face plate, a ventilation channel, a tightening protrusion, a battery opening with engaging means, an ear wax guard holder, etc, can be produced automatically with a minimum of manual operations.

Preferably, the shell is produced from a flexible, sweat resistant material. The material should not cause allergic reactions.

The shells are preferably polished in a polishing cylinder.

The material may be colorless or may be of a color that is close to a desired color. Then, the shell may be colored in a coloring substance of a desired color, e.g. by dipping the shell in the coloring substance.

BRIEF DESCRIPTION OF THE DRAWINGS

The invention will now be explained in greater detail with reference to the drawing in which:

FIG. 23 shows an electronic module for use in the hearing aid of FIG. 18, FIG. 24 shows the socket part of the electronic module, FIGS. 25–27 show the design of a battery lid, FIG. 28 is an example of a hearing aid battery for use in the hearing aid of FIG. 18, FIG. 31 shows examples of cross-sections of the ventilation channel in the shell, FIG. 32 shows a shell with and without a tightening ring.

DETAILED DESCRIPTION OF PREFERRED EMBODIMENTS

Figure 1:
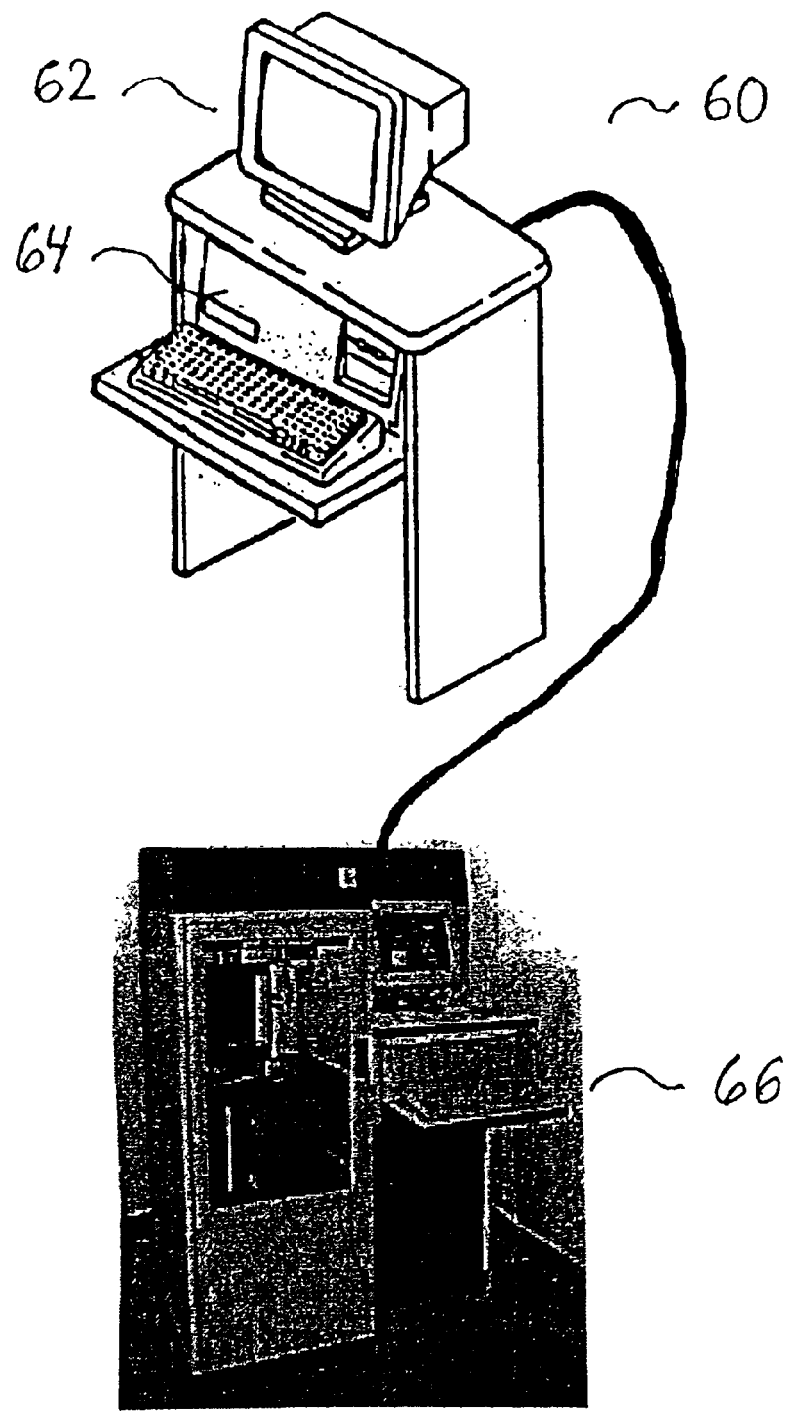
FIG. 1 shows a CAD/CAM system according to the present invention.

FIG. 1 illustrates a CAD/CAM system 60 according to the present invention, comprising a processor 64 and a computer display 62. The CAD/CAM system 60 is adapted for design and manufacture of a hearing aid housing comprising a face plate and a shell that is matched to the auditory canal of a user. Data representing the shape of the auditory canal are received and stored by the system. Upon receipt of the data, the processor 64 forms a three-dimensional model of the auditory canal and a part of the corresponding outer ear based on the data. The model is manipulated to form a three-dimensional model of the desired hearing aid housing having a shell that matches the auditory canal. The hearing aid housing model is further manipulated according to well-known methods of CAD/CAM systems to design and produce a desired hearing aid housing. In the design process, the model may be displayed on the computer display 62 in various three-dimensional views and two-dimensional cross-sections, and various operator controlled functions for adjustment of the model are provided.

During the design process, the model of the auditory canal remains unchanged while the model of the hearing aid shell is subject to modifications and additions of various features. The models may be displayed in distinguishable colors, and the shell may be displayed inserted in the auditory canal. For this and other purposes, the model of the auditory canal may be displayed transparently.

Upon completion of the hearing aid housing model, the corresponding hearing aid housing is produced, e.g. with an integrated face plate, based on the model and utilizing a rapid prototyping apparatus 66. In the shown embodiment, the rapid prototyping apparatus 66 is a commercially available stereolithography apparatus 66.

Figure 2:
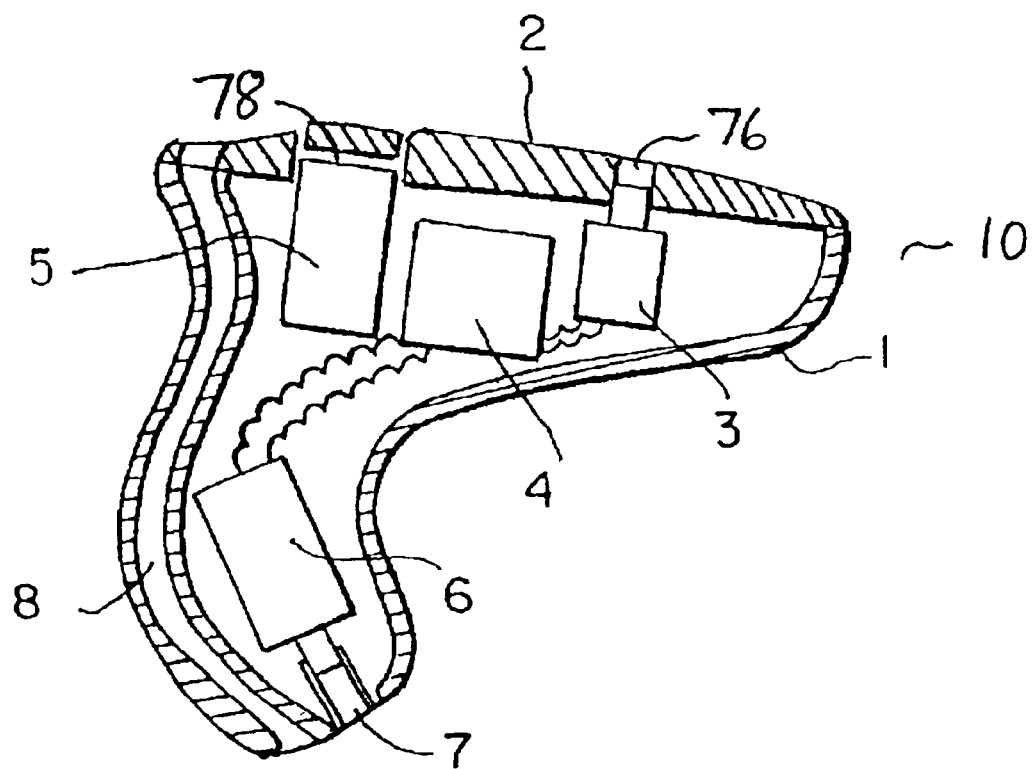
FIG. 2 shows a cross-sectional view of an in-the-ear hearing aid.

FIG. 2 schematically shows an in-the-ear hearing aid 10 with a shell 1 that is covered by a face plate 2 with a battery opening 78 and a microphone opening 76. The hearing aid contains a microphone 3, an electronic amplifier 4, a battery 5, a receiver 6, an acoustic output opening 7, and a ventilation channel 8.

Figure 3:
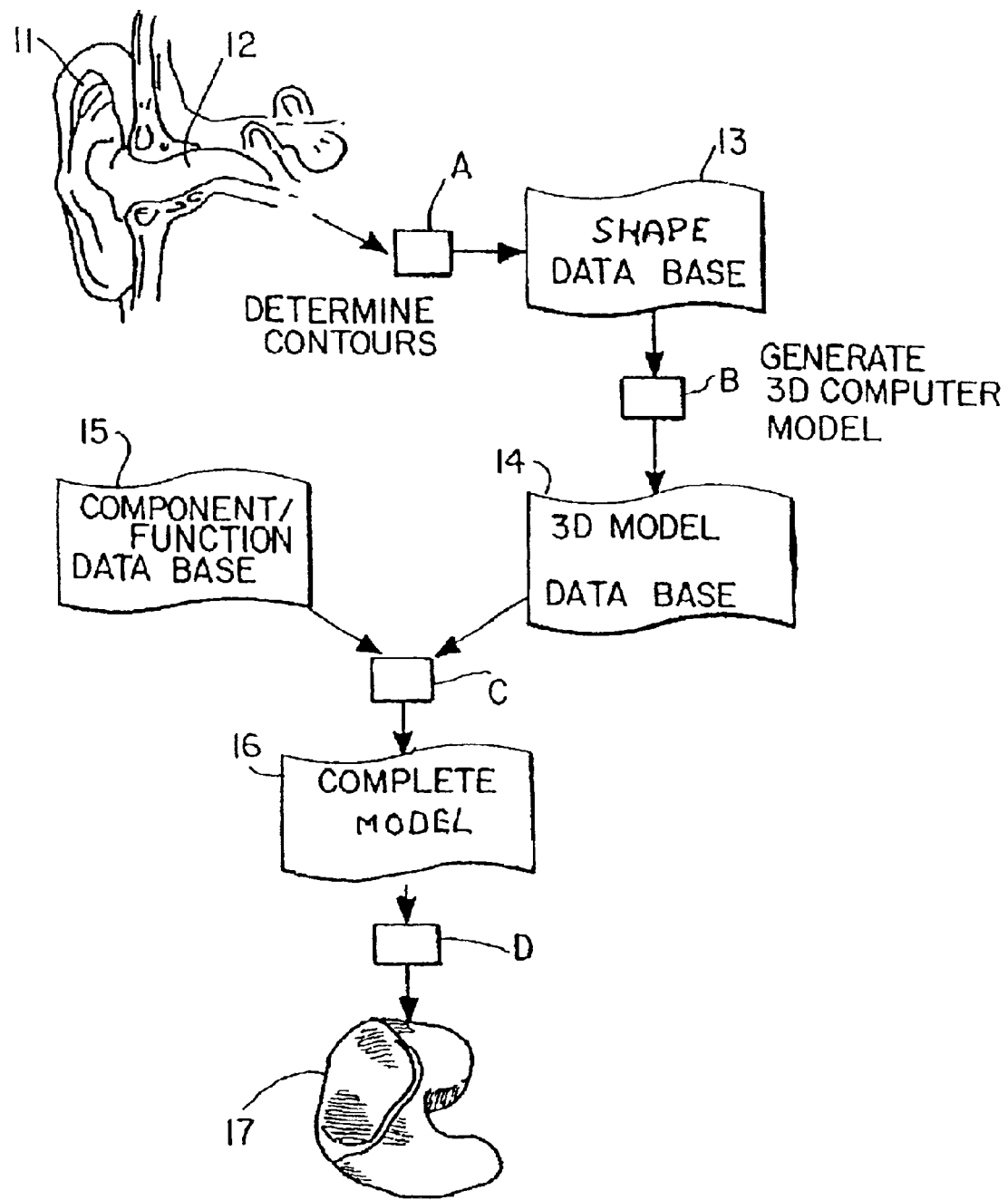
FIG. 3 illustrates schematically the process steps of an embodiment of the present invention for manufacturing a hearing aid.

The general principle of a method according to the invention is shown in FIG. 3. A schematically shown ear 11 possesses an auditory canal 12, the shape of which it is desired to acquire and represent with digital data.

In FIG. 3, the shape of the auditory canal is determined at A and digitally stored in a memory 13. The digital data are converted into a three-dimensional computer model of the shell at B and saved in a data memory 14. Models of components for or features of in-the-ear hearing aids are stored in a data base 15. Thus, the data base 15 contains dimensions and performance data of available components and features, such as various sizes and shapes of receivers, microphones, amplifier sections, batteries, etc.

The data stored in the data memory 14 and data base 15 are then combined at C to incorporate the necessary functions or features in the three-dimensional computer model, e.g. of an in-the-ear hearing aid, in an optimum way. As a result, a complete model of a hearing aid housing is obtained in the memory 16 which may form a part of a data base for storage of complete models of hearing aids. Then, the housing 17 is produced in a computer controlled production process D on the basis of the model of the housing stored in the memory 16.

Figure 4:
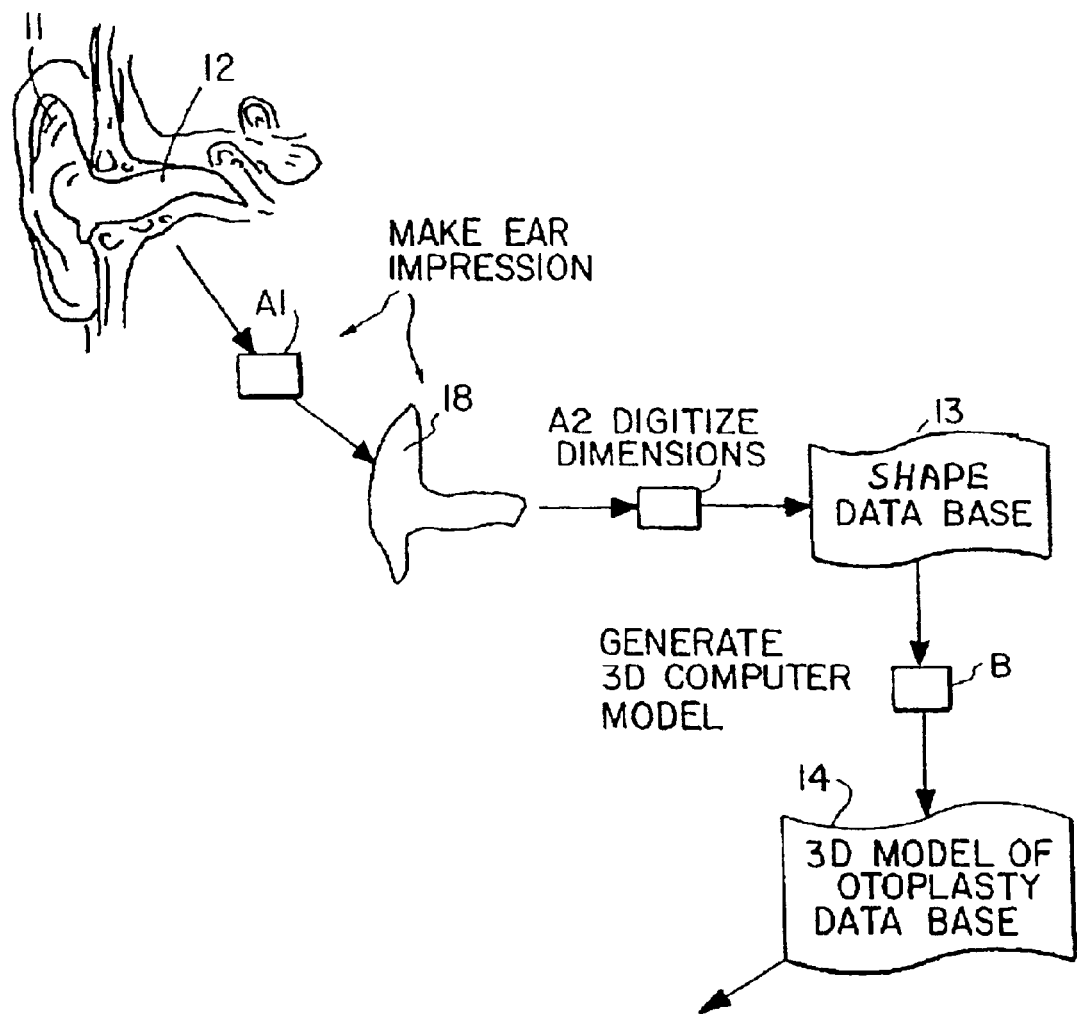
FIG. 4 illustrates schematically the process steps of an embodiment of the present invention for acquiring the shape of the auditory canal.

The principles of a static method for determining the shape of an auditory canal is schematically shown in FIG. 4. An ear impression 18 is made of the ear 11 with its auditory canal 12 at A1, the dimensions of ear impression 18 is digitized at A2, and the resulting data are stored in the memory 13. Then, the data are converted into a three-dimensional computer model at B and the model is stored in the data memory 14.

Figure 5:
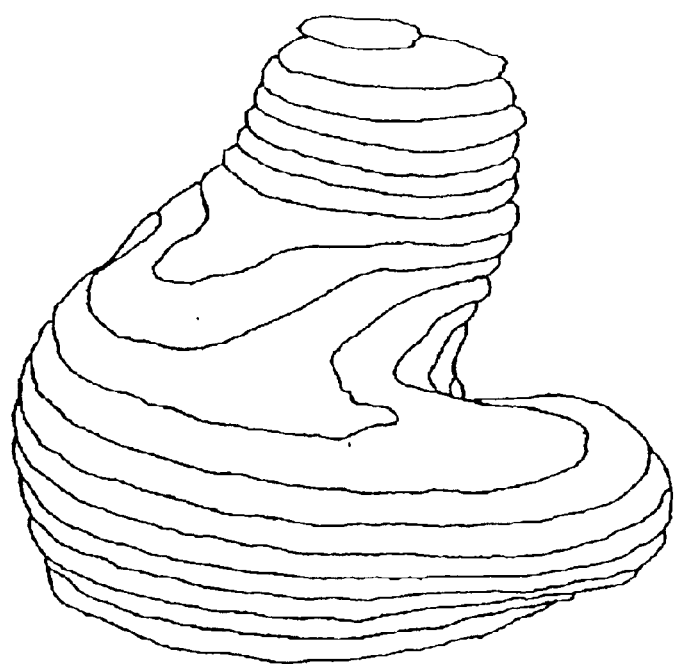
FIG. 5 shows a computer representation of the acquired shape of an ear impression.
Figure 6:
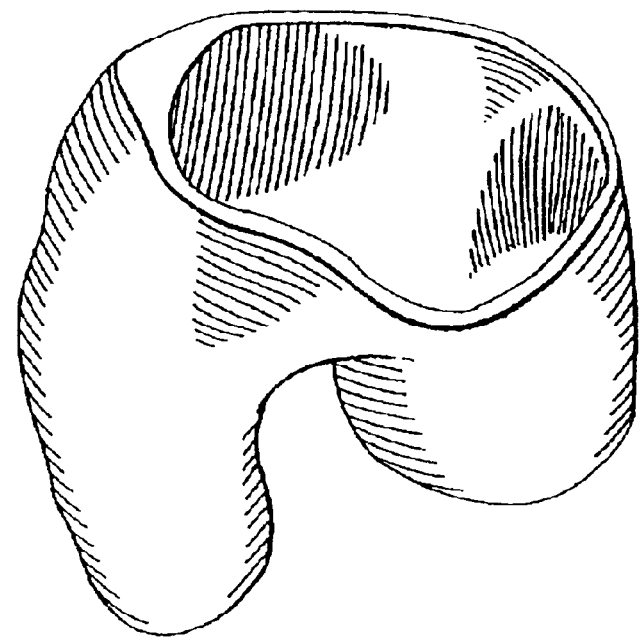
FIG. 6 shows a three-dimensional computer model of a shell with already calculated wall thickness for definition of the interior cavity at the inner surface.

FIG. 5 shows a computer representation of the acquired shape of an ear impression. When data representing the shape of the auditory canal are available in the memory 13, it is possible to convert the data using algorithms well-known in the field of CAD/CAM technology to produce a three-dimensional computer model of the matching shell of the hearing aid housing to be produced. FIG. 6 shows a three-dimensional computer model of a shell wherein wall thickness has already been selected for definition of the interior cavity defined by the shell.

The conversion of data into a computer model may be performed interactively under user control or fully computer controlled.

Figure 7:
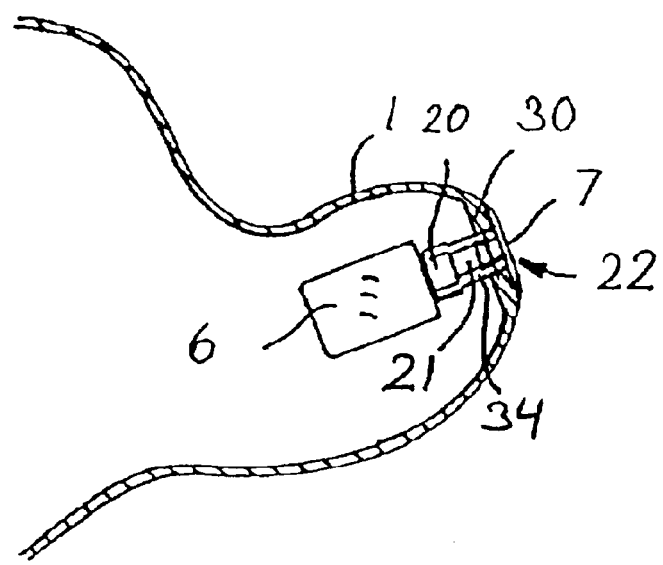
FIG. 7 shows a cross-section of a part of a hearing aid housing with the acoustic output opening.
Figure 8:
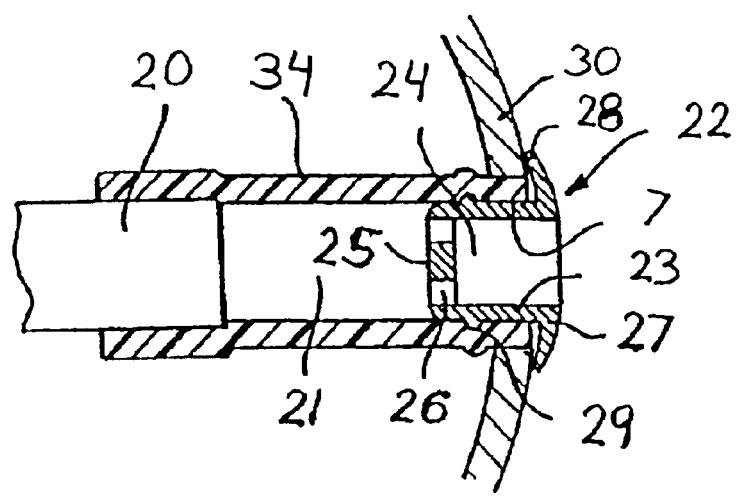
FIG. 8 shows a part of FIG. 7 in enlargement.
Figure 9:
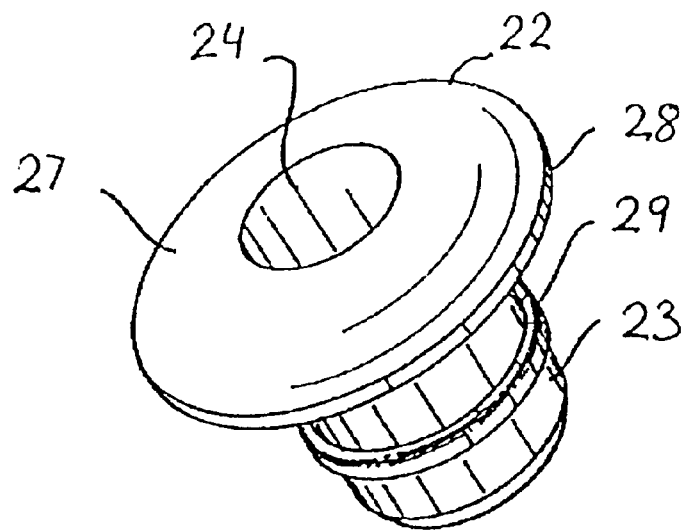
FIG. 9 is a perspective view of an ear wax guard.

FIG. 7 shows a part of the shell 1 facing the inner ear. The receiver 6 is illustrated with an output port 20 that communicates with the acoustic output opening 7 through an acoustic outlet canal 21 formed by a hose member 34 made of plastics. In order to avoid contamination of the interior of the housing 1 with cerumen or ear wax entering the acoustic output opening 7, an ear wax guard 22 is placed therein.

As shown in FIGS. 7–10, the ear wax guard 22 comprises a short, essentially circular cylindrical tubular member 23 with a length and an outer diameter adapted for insertion into the acoustic outlet canal 21 with frictional fit.

Figure 10:
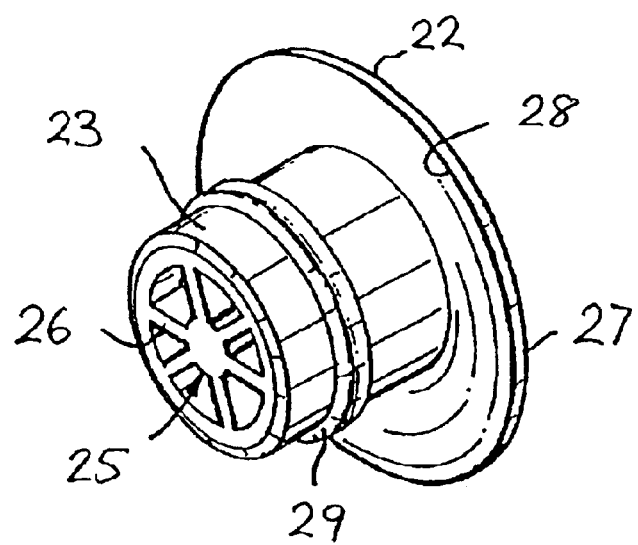
FIG. 10 is another perspective view of the ear wax guard.

An essentially circular cylindrical bore 24 in the tubular member 23 is partially closed by an ear wax retaining barrier 25 at the end that is inserted into the acoustic outlet canal 21. The barrier 25 may constitute a screen with loops and radial threads as shown in FIG. 10.

At the opposite end of the tubular member 23, the ear wax guard 22 has a collar 27 which in the inserted position sealingly abuts the end wall part 30 surrounding the acoustic output opening 7. In the shown embodiment, the collar 27 has a convex upper side and a concave or slightly conical lower side, the peripheral edge of the collar forming a relatively thin and soft sealing lip 28 against the end wall part 30. Thus, a high degree of security is obtained against migration of ear wax under the periphery edge of the collar and the ear wax guard will in inserted position follow the contour of the shell. This is very important in relation to comfort, especially for CIC (Completely In the Canal) hearing aids which are placed in the innermost sensitive part of the auditory canal.

The ear wax guard 22 is manufactured of a resilient material, such as silicone rubber or a thermoplastic elastomer, typically with an outer diameter of 2.25–1.5 mm and an inner diameter of the bore 24 of about 1 mm.

For an improved securing of the ear wax guard 22 in the acoustic outlet canal 21, the tubular member 23 can on the outside be provided with means for frictional engagement, e.g. in the form of at least one circumferential bead 29.

An ear wax guard as shown and described may also be placed in the ventilation channel opening in the shell.

Figures 11, 12:
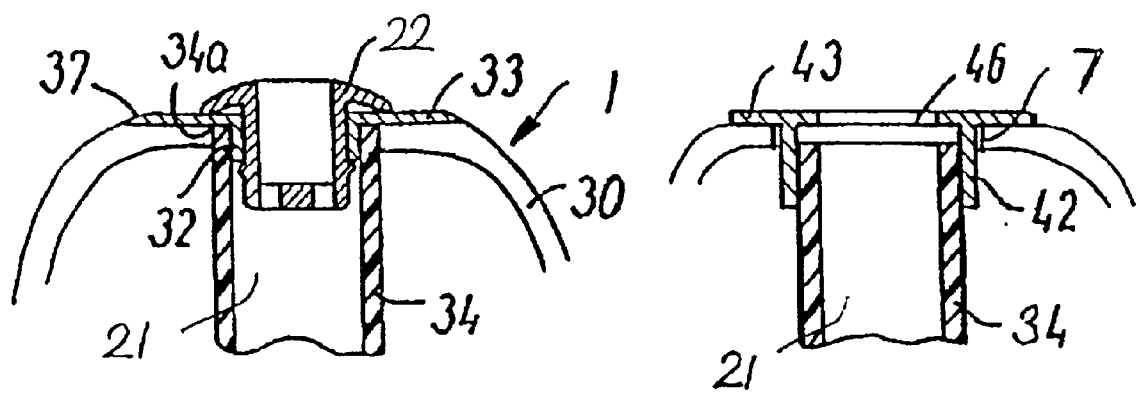
FIG. 11 shows a cross-section of a part of a hearing aid housing with the acoustic output opening designed for positioning of an ear wax guard.
FIG. 12 is a modification of the embodiment in FIG. 11, FIGS. 13–17 illustrate a method for use in production of the hearing aid according to the invention.

In the embodiment shown in FIG. 11, the ear wax guard 22 is mounted in a bushing 32 with an annular collar 33 in abutment against the outside of the end wall part 30 of the shell 1. The bushing 32 is preferably made of a material with a larger rigidity, e.g. plastics or metal, than both the elastic hose member 34 serving as acoustic outlet canal 21 and the ear wax guard 22. The bushing 32 is mounted inside the hose member 34 and may be fixed to the end of the hose member 34 by gluing or welding of the collar 33 to the end wall part 30 and/or it may be inserted with an interference fit in the hose member 34.

Preferably, the periphery edge 37 of the collar 33 is tapered to provide a smooth transition between the collar 33 and the end wall 30.

In the embodiment shown in FIG. 12, a mounting bushing 42 with a collar 43 is adapted to be mounted directly in the acoustic output opening 7. The hose member 34 forming an acoustic outlet canal 21 may be mounted on the outside of the bushing 42 as shown in FIG. 11 but in the embodiment shown in FIG. 12, the hose member 34 is mounted inside the bushing 42.

Figure 13:
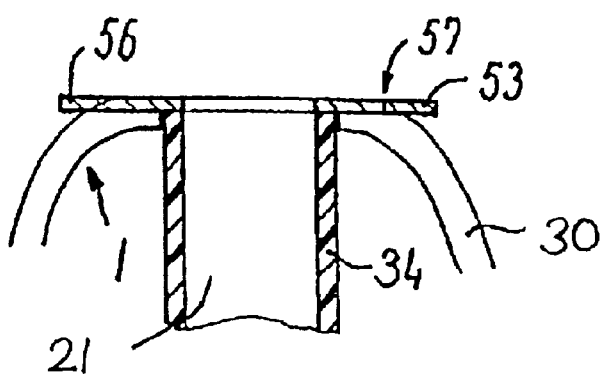

FIG. 13 illustrates fitting of a collar 53 to the end wall part 30 of a shell 1 by cutting to a suitable diameter as indicated by 57 and then by grinding to obtain a smooth transition between the collar 53 and the end wall part 30. Also in the embodiments shown in FIGS. 11 and 12, the bushings 32 and 42 with the collars 33 and 43 may be adapted to the shell 1 in the same way.

Figure 14:
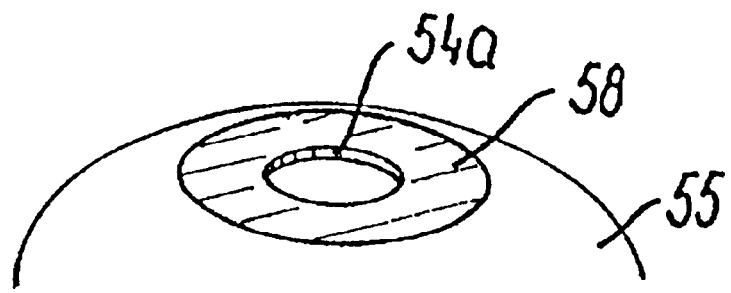
Figure 15:
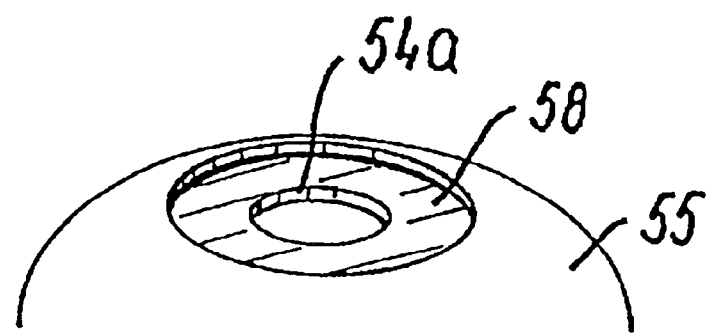

As shown in FIGS. 11–17, it is preferred that the collar has the form of a disc with a flat surface for abutment against the end wall part 30 of the shell 1. Correspondingly, the end wall part 30 of the shell 1 is provided with a flat abutment surface 58 for reception of the collar. As shown in FIG. 15, the shell 1 may be manufactured so that the surface 58 is countersunk in the hearing aid shell 1, preferably without changing shell wall thickness.

Figure 16:
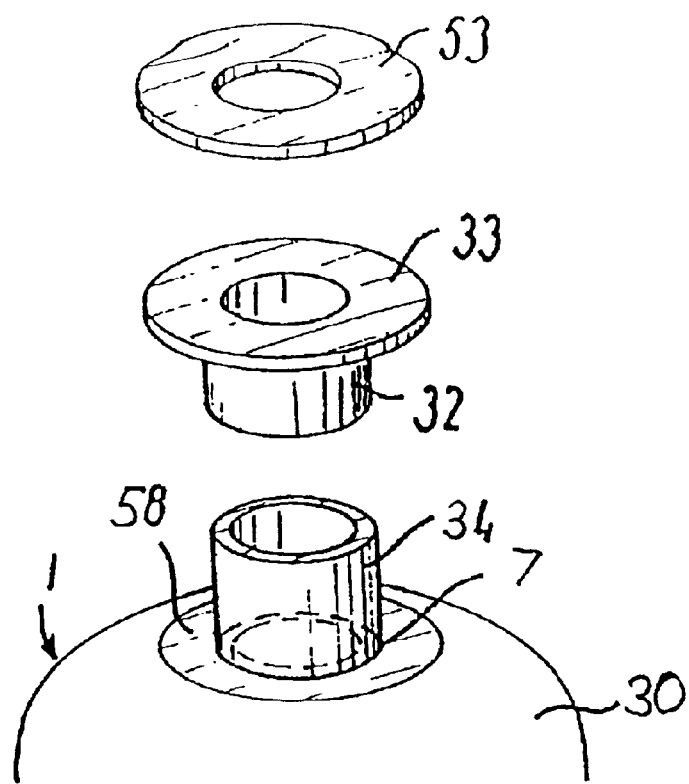

As shown in FIG. 16, during assembly of the shell 1, the hose member 34 may be provided with a surplus length which is guided through the acoustic output opening 7 in the end wall part 30 of the shell 1 and fastened thereto by gluing or welding whereupon the projecting part of the hose member 34 is cut flush with the surface 58. Then the shell 1 may be provided with a collar 53 without a mounting bushing as shown in FIG. 14. The collar 53 is fixed to the surface 58 by gluing or welding, or, the shell 1 may be provided with a mounting bushing 32 as shown in FIG. 11 with a collar 33 that is inserted into the end of the hose member 34.

Figure 17:
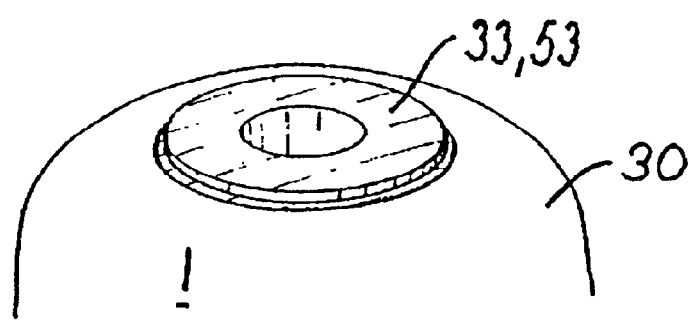

The assembled shell 1 with the collar 33 or 53 mounted on the end wall part 30 of the shell 1 is shown in FIG. 17.

Figure 18:
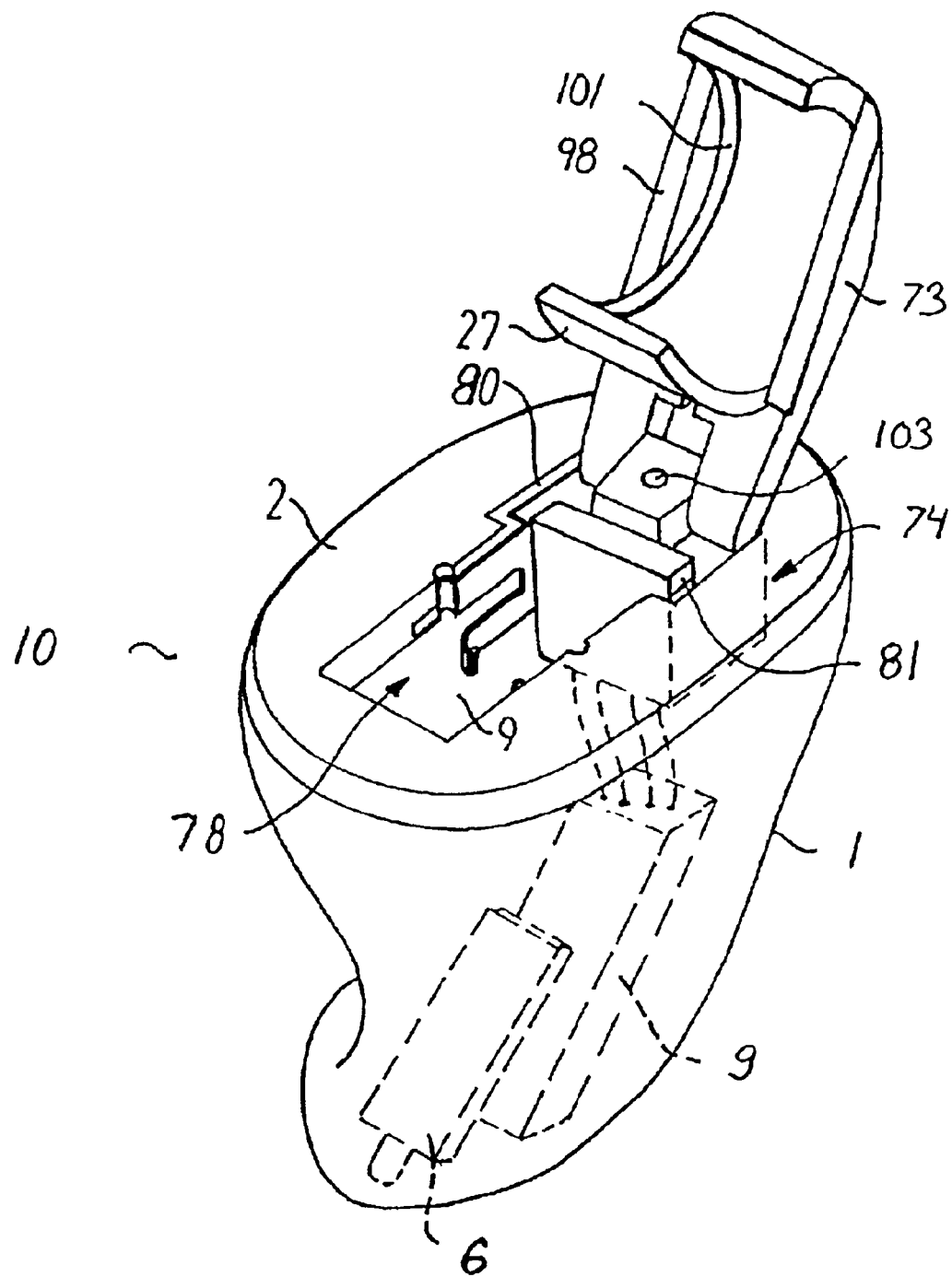
FIG. 18 is a perspective view of an embodiment of a hearing aid housing according to the invention.

FIG. 18 shows in more detail the mounting of an electronic module 74 in a hearing aid housing 10 according to the present invention. The housing 10 comprises a shell 1 adapted to the auditory canal and having a generally irregular conical shape, a face plate 2 covering the outward opening of the shell 1, a battery lid 73 pivotally connected with the face plate 2, and an electronic module 74 having a microphone 3, a signal processor 9 and a sound reproducer or receiver in the form of a telephone 6.

The face plate 2 may be an integrated face plate, however in the shown embodiment, the face plate 2 has been manufactured separately from the shell 1. Features of the face plate 2 are shown in more detail in FIGS. 19 and 20. Prior to fixing the face plate 2 to the shell 1, the contour of the face plate 2 has been formed by cutting or milling according to the junction contour previously specified in the model of the hearing aid housing and also defining the outward opening of the shell 1. The contour corresponding to the junction contour is indicated as a dashed line 2' in FIGS. 19 and 20. Having fastened the face plate 2 to the shell 1, e.g. by gluing, the other components are mounted in the hearing aid housing. It is an important advantage of this embodiment of the present invention that the shell 1 with the face plate 2 can be cleaned after the finishing so that the other components are not exposed to pollution during their mounting.

As shown in FIGS. 18–22, a battery opening 78 is formed in the face plate 2 for removable arrangement of the electronic module 74, and a battery which may be formed as shown in FIG. 28 for insertion in the lid 73 that is formed as a battery holder. For this purpose, the battery opening 78 comprises a first region 79 for positioning of the battery and a second region 80 coherent therewith for insertion of a socket 81 of the electronic module 74 housing the microphone 3 of the module.

To retain the socket 81 of the electronic module 74, integral engaging means are formed at the edge of the battery opening 78 as shown in FIGS. 19–22. In the shown embodiment, the engaging means comprise a pair of grooves 82 and 83 which are arranged opposite to each other at opposite edges of the battery opening 78 in the first region 79 for positioning of the battery. These grooves 82 and 83 serve to retain the socket 81 against displacement in the plane of the face plate 2. The engaging means further comprise a pair of tracks 84 and 85 facing each other for retention of the socket 81 against displacement at right angles to the face plate 2 into the shell 1 and a notch 86 for retention of the socket 81 against displacement in the opposite direction.

For engagement with the engaging means formed in the face plate 2, the socket 81 of the electronic module 74, as seen more clearly in FIGS. 23 and 24, is formed with laterally projecting ribs 87 for arrangement in the tracks 84 and 85, and with a cam-like, backward projection 88 for engagement with the notch 86, and with protruding resilient lugs 89 for location in the grooves 82 and 83.

Figure 19:
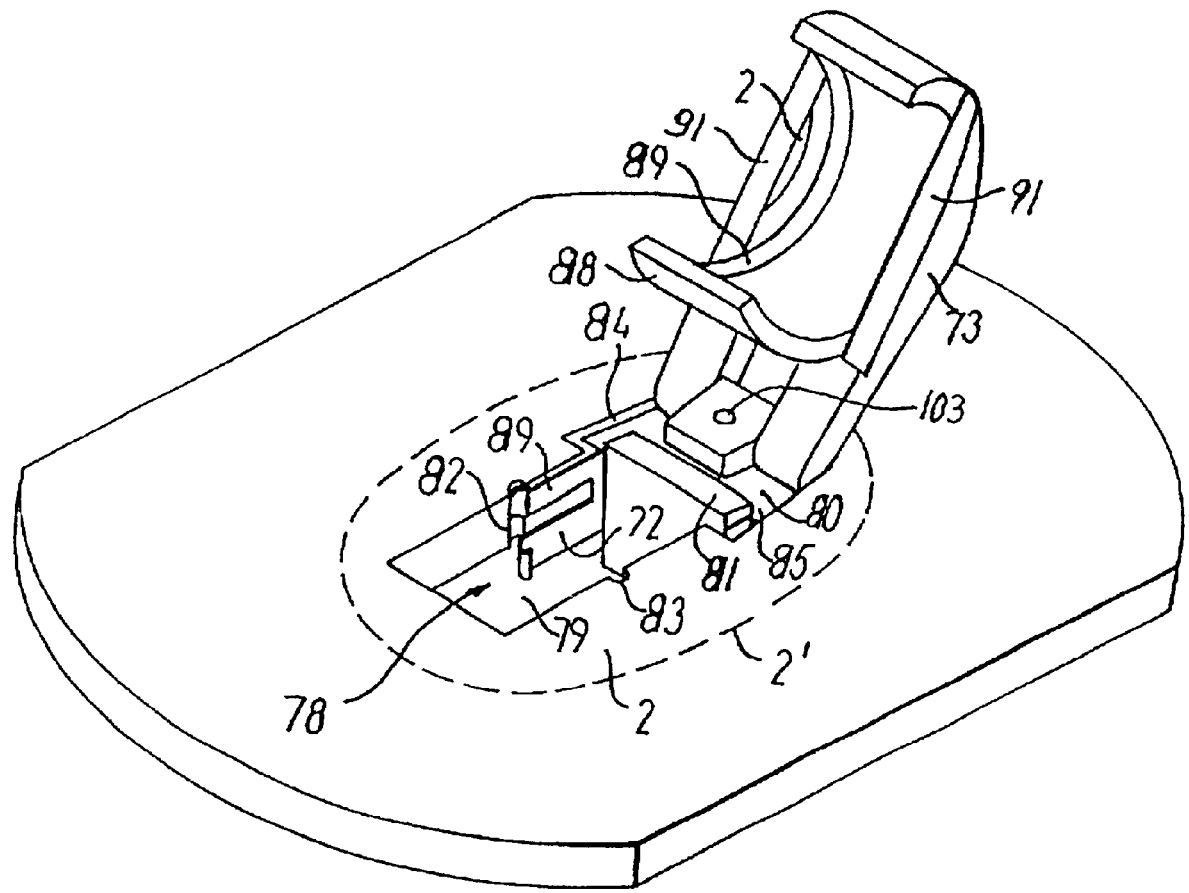
FIG. 19 is a perspective view of a face plate for use in the hearing aid of FIG. 18 with an inserted electronic module and a battery lid connected with the face plate.

When the electronic module 74 is arranged in the face plate 2 with the battery lid 73 pivoted out to the position shown in FIGS. 18 and 19, the parts of the electronic module intended for arrangement in the shell 1 under the face plate 2, i.e. the signal processor 9 and the telephone 6, are passed through the battery opening 78 down into the shell 1. The socket 81 is then placed with the ribs 87 in the tracks 84 and 85 and is displaced in or pivoted towards the plane of the face plate 2 so that the projection 88 is brought into engagement with the notch 86 whereby the resilient lugs 89 also engage with the grooves 82 and 83.

The engaging means at the edges of the battery opening 78 and the matching engaging means on the socket 81 of the electronic module 74 may be formed so that the electronic module 74 is passed substantially at a right angle into the second region 80 of the battery opening 78 and is then displaced in the plane of the face plate for provision of the engagements described above. Preferably, however, the socket 81 is passed at an oblique angle into the battery opening 78 with abutment on its edge at the notch 86, whereupon the socket is pivoted into place and fastened by engagement of the resilient lugs 89 with the grooves 82 and 83 and of the projection 88 with the notch 86. In this design, the end of the tracks 84, 85 and the corresponding ends of the ribs 87 may be formed for mutual abutment and for retention of the socket 81 against displacement in the plane of the face plate 2 after mounting of the socket in the battery opening 78.

When the electronic module 74 is removed from the hearing aid, the resilient lugs 89 can be released from their engagement with the grooves 82 and 83 by means of a suitable tool, whereupon the socket 81 is pivoted upwards with the back edge at the notch 86 as the pivot point for release of the projection 88 from its engagement with the notch 86 so that the socket 81 can be removed from the face plate 2, and the other components 76 and 77 of the electronic module 74 can be lifted out from the interior of the shell 1 through the battery opening 78.

This design, where the socket 81 can be pivoted in and out of its position is especially advantageous since the engaging means 82–86 in this design, apart from being formed compactly, do not require space for displacement of the socket 81 into the region 79 at insertion and removal. The design at the same time still provides good retention of the socket 81, since the resilient lugs 89 project into the region 79 for positioning of the battery and act as levers that provide a strong fastening of the socket and prevent its unintended pivoting out after the mounting. The relatively large length of the resilient lugs 89 projecting into the region 79 simultaneously facilitates removal of the socket 81 since the lugs 89 are pushed out of engagement easily by a relatively small use of force at the outer ends of the lugs 89.

Figures 20, 21, 22:
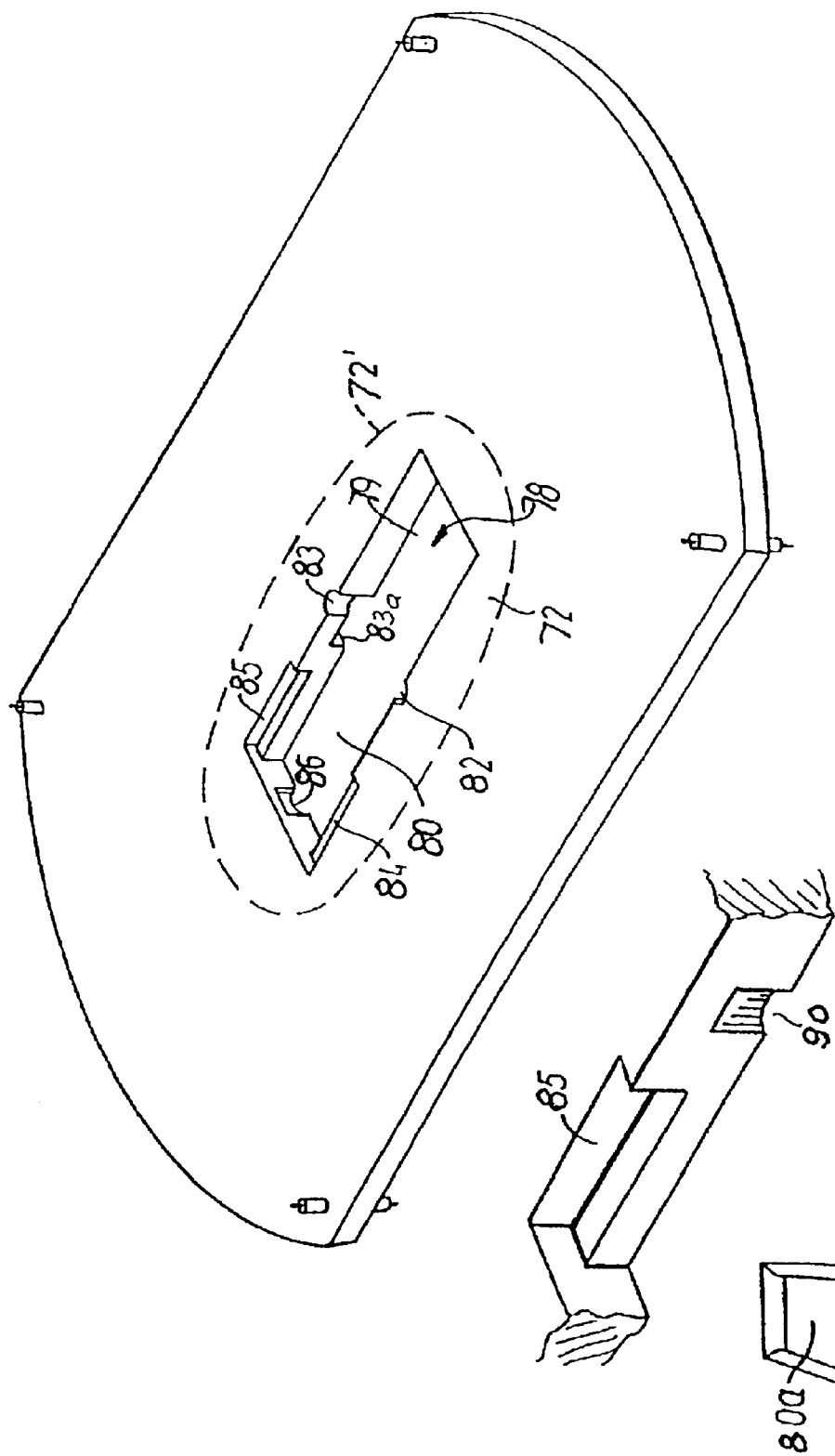
FIG. 20 is a perspective view of the face plate itself.
FIG. 21 shows details in the design of the face plate.
FIG. 22 shows other details in the design of the face plate.

FIG. 21 shows an alternative design of the engaging means at the edge of the battery opening 78, the grooves 82 and 83 being replaced by upwardly closed recesses 90. In another embodiment, the grooves 82 and 83 open out downwards into groove tracks 83a which, as shown in FIG. 20, expand from the aperture. This design provides good engagement of the resilient lugs 89 preventing unintended pivoting out of engagement.

Another embodiment of the engaging means is shown in FIG. 22 wherein the second region 80a of the battery opening 78 has a truncated wedge shape. The tracks 84 and 85 and the notch 86 are replaced by inwardly projecting, arched ribs 91 at opposite edges of the battery opening 78 retaining the socket 81 in both directions at right angles to the face plate 2 by engagement with grooves in the socket 81 instead of the ribs 87.

As shown in FIGS. 23 and 24, the protruding resilient lugs 89 from the socket 81 may suitably be formed with integral battery terminals 92 since, after mounting of the socket 81, the lugs project into the first region of the battery opening 78 where they contact the terminals of the battery 93 shown in FIG. 28 when the pivotal lid 73 is in its closed position.

As shown in FIGS. 18 and 23, the pivotal battery lid 73 is hinge-connected to the socket 81 of the electronic module 74 by the socket being formed with hinge bearings 94 with holders for a pin 95 which can engage with hinge tracks 96 formed at one end of the battery lid 73.

To retain the battery 93, the battery lid 73 has a partially cylindrical wall 97 extending over at least 180° and defining a battery space 99 together with circular-section-shaped edge flanges 98. One terminal, usually the negative terminal on the battery 93, is formed as a pole button 100 as shown in FIG. 28, and the cylindrical wall 97 at one side of the battery lid 73 may be formed with an upright annular edge 101 which, at correct arrangement of the battery, encloses the pole button 100, but which, if the battery is turned the wrong way, prevents closing of the battery lid 73. This prevents insertion of the battery with an incorrect polarization. In the embodiment shown, where the battery lid 73 is formed with edge flanges 98 at both sides, the side of the edge flange 98 where the pole button 100 is placed is formed with a depression 102 providing room for the pole button.

When the battery lid 73 is closed, the circular-section-shaped edge flanges 98 abut the exterior of the face plate 2 around the battery opening 78, ensuring correct positioning of the battery 93 at its insertion into the first region 79 of the battery opening 78. Advantageously, the face plate 2 forms a plane disc without protrusions for the battery lid whereby the manufacturing of the hearing aid is simple cheap, and insertion and removal of the components of the hearing aid are easily performed.

As shown in FIGS. 18, 19 and 25, the design of the battery lid results in retention of the battery 93 with uncovered battery terminals formed by the pole button 100 and the end surface of the battery opposite thereto so that at closure of the battery lid, the terminals are directly brought into contact with the integral battery terminals on the resilient lugs 89 on the socket 81.

At the closure of the battery lid, the main part of the partially cylindrical wall 97 will furthermore be placed up against the socket 81, while the remaining part of the circumferential surface of the battery is not enclosed by any socket that would take up space in the interior of the shell 1. The wall of the shell 1 can be located very close to the battery so that the shell can be formed with small dimensions.

In addition to causing accurate positioning and retention of the electronic module in relation to the face plate 2, the socket 81 supports the battery terminals 92 of the electronic module directly, and in combination with the hinged battery lid it provides a secure guiding of the battery during closure of the battery lid.

In the electronic module, the microphone 3, as it appears particularly from FIGS. 18, 19, 23 and 26, is directly connected with the socket 81 and communicates with the surroundings through microphone ports 103 and 104 formed in the socket 81 and the battery lid 73, respectively, so that with a closed battery lid they register to provide well-defined sound access to the microphone 3. In the embodiment shown, the microphone port 104 in the battery lid 73 is formed as an open slit which can be cleaned relatively easily by opening the battery lid 73.

As shown in FIG. 23, the signal processor 9 with the amplifier circuit of the hearing aid is connected via flexible wires 105 to terminals 106 on the socket 81, and correspondingly, the telephone 6 is connected with the signal processor 9 via flexible wires 107. This allows the most suitable arrangement of the signal processor 9 and the telephone 6 in the individually adapted shell 1.

Figure 29:
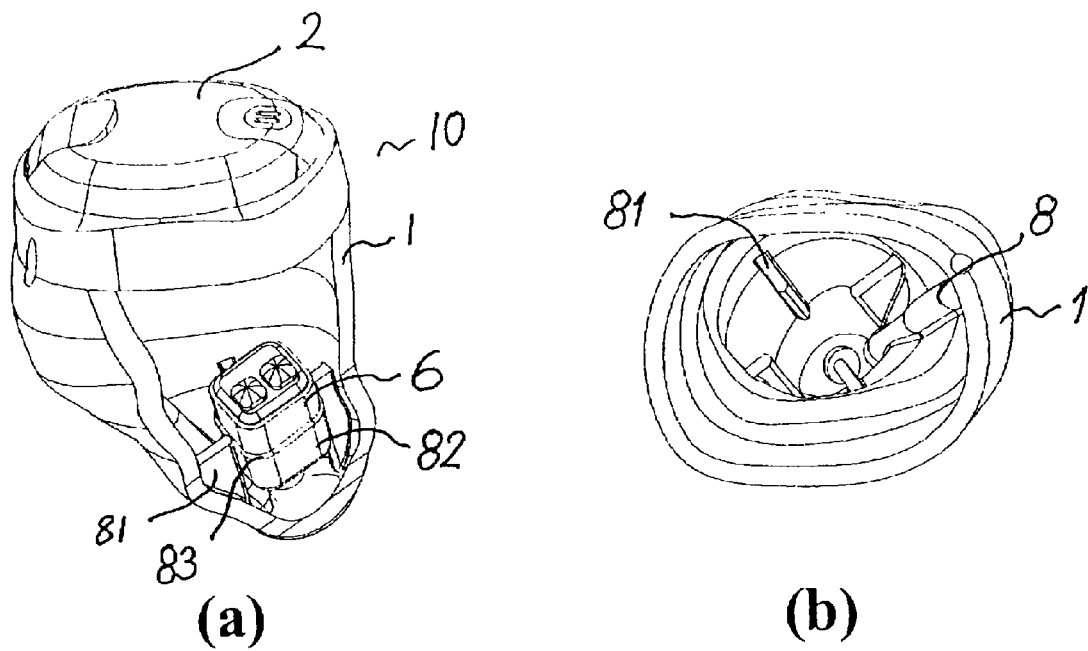
FIG. 29a shows receiver holders in the shell with the receiver installed.
FIG. 29b shows receiver holders in the shell without the receiver.

FIGS. 29*a* and 29*b* illustrate an embodiment wherein the receiver is inserted in receiver holders 81 in the form of shell protrusions 81 extending inwardly into the interior of the shell 1. Preferably, at least three protrusions, such as four protrusions, are provided for receiving and holding the receiver 6 in such a way that mechanical vibrations generated by the receiver 6 do not propagate to the hearing aid shell 1 or other parts of the hearing aid 10 causing e.g. unwanted feed-back or other disturbing effects. Flexible suspension of the receiver 6 between the receiver holders 81 is provided by one or more flexible bands 82, e.g. made of silicone, surrounding and clutching the receiver 6 and having at least one bead or protrusion 83 encircling the receiver 6 providing a safe and vibration absorbing mounting of the receiver 6 in the hearing aid housing.

Figure 30:
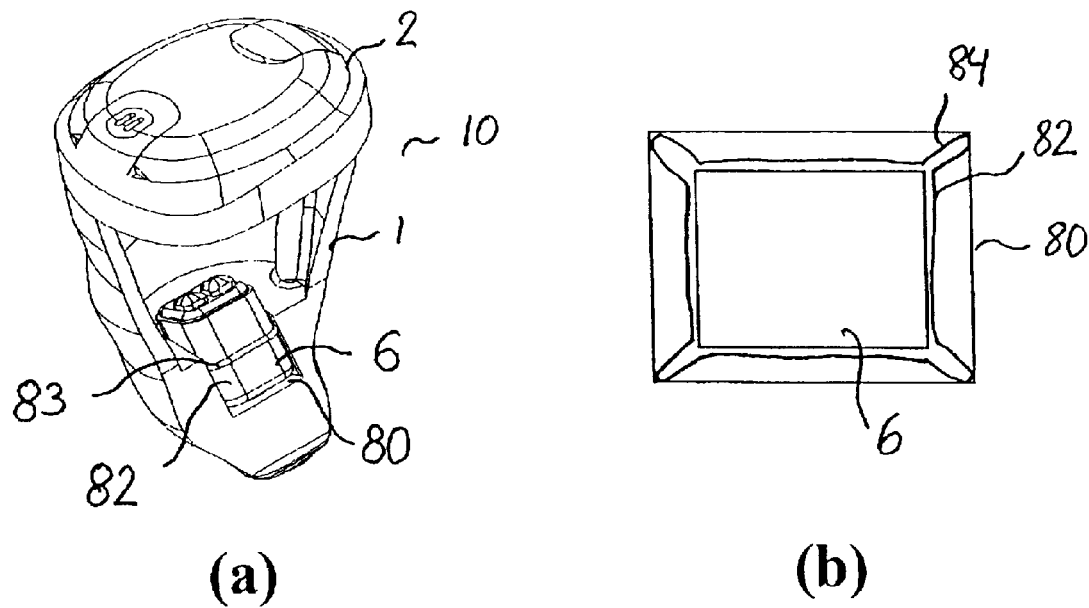
FIG. 30a shows the receiver chamber in the shell.
FIG. 30b shows the suspension of the receiver in the receiver chamber.

FIG. 30*a* illustrates a receiver chamber 80 that is adapted to receive and hold the receiver 6 in such a way that mechanical vibrations generated by the receiver 6 do not propagate to the hearing aid shell 1 or other parts of the hearing aid 10 causing e.g. unwanted feed-back or other disturbing effects. As further illustrated in FIG. 30*b*, the flexible suspension of the receiver 6 in the receiver chamber 80 is provided by one or more flexible bands 82, e.g. made of silicone, surrounding and clutching the receiver 6 and having protrusions 84 preferably positioned at the corners of the receiver 6 and extending towards corresponding corners of the receiver chamber 80 thereby providing a safe and vibration absorbing mounting of the receiver 6 in the hearing aid housing.

The CAD/CAM system is adapted to include a model of the receiver holder, such as a receiver chamber, shell protrusions, etc, in the shell model. Preferably, the receiver holders are automatically adapted to fit a selected receiver.

FIGS. 31(*a*)–(*d*) shows cross-sections of various embodiments of the ventilation channel 8. Position, path and cross-section of the ventilation channel 8 may be selected, e.g. using a CAD/CAM design system. The cross-section may remain constant along the path of the ventilation channel or the cross-section may vary in steps, preferably in multiple steps, in order to achieve a low-pass filter effect of sound. A three-dimensional computer model of the selected ventilation channel is formed and included in the model of the shell. The components of the hearing aid, such as a receiver, a microphone, an amplifier, a telephone coil, etc, may be selected from the data base 15 with three-dimensional models of the respective components. The selected components may be displayed as positioned within the shell model for optimum positioning of the components and optional collision control. The position, path and shape of the ventilation channel may be further modified in order to permit optimum utilization of the available space inside the hearing aid shell. In embodiment (a) the ventilation channel 8 has its own wall, and in embodiment (b) the ventilation channel 8 is partially integrated in the wall of the shell 1 in that part of the ventilation channel wall is constituted by part of the shell wall. This minimizes the volume occupied by the ventilation channel (8) leaving more room for other components of the hearing aid. It is also seen that ventilation channels 8 with a circular cross-section create a volume 19 at the transition between the shell wall and the ventilation channel wall that is difficult to utilize. As shown in FIG. 31(*d*), a square or rectangular cross-section minimizes the volume 19. However, the cross-section shown in FIG. 31(*c*) substantially does not create a volume 19 that is difficult to utilize. Further and if appropriate, the ventilation channel 8 may be fully integrated in the shell wall.

A hearing aid shell 1 with a tightening ring 86 is illustrated in FIG. 32. In FIG. 32(a), the shell 1 is shown having a groove 88 extending along the selected tightening contour. The groove has a cross-section with a shape and dimensions that match the desired tightening ring 86. The shell 1 with the tightening ring 86 mounted in the groove 88 is shown in FIG. 32(b). As already mentioned, the tightening ring provides an appropriate, comfortable and secure tightening of the shell to the auditory canal when the shell is mounted in the auditory canal.

Figure 33:
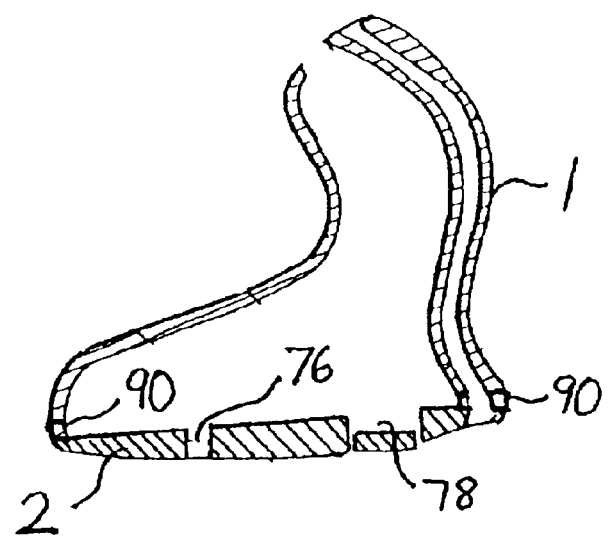
FIG. 33 shows a cross-section of a shell produced according to a preferred embodiment of the invention.

FIG. 33 illustrates a manufacturing method according to the present invention wherein the face plate 2 is separately manufactured including a battery opening 78. Preferably, the plate 2 also comprises the engaging means. The shell 1 of the hearing aid housing is produced on top of the plate 2, e.g. using stereolithography, layer by layer, the first layer 90 or cross-section of the shell 1 surrounding the battery opening 78 along the previously selected junction contour of the hearing aid housing.

Figure 34:
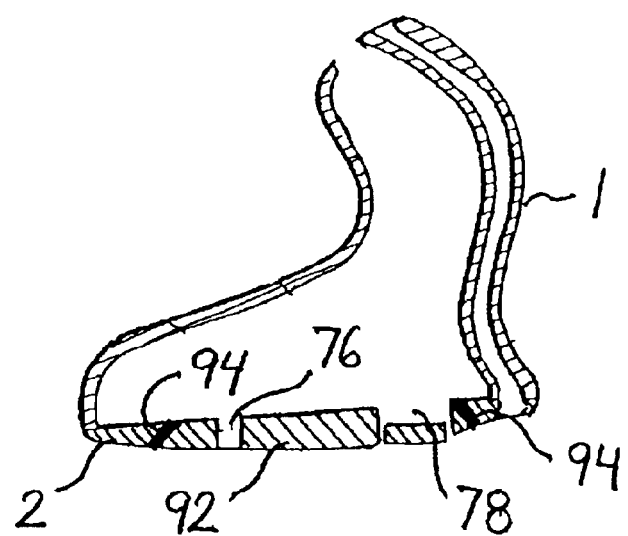
FIG. 34 shows a cross-section of a shell produced according to another preferred embodiment of the invention.

In another embodiment of the invention shown in FIG. 34, only a part 92 of the face plate 2 including the battery opening 78 is separately manufactured. The circumference 94 of the part 92 is included in the hearing aid housing model, and the hearing aid housing is produced with an integrated face plate 2 attached to or abutting the separately manufactured part 92 layer by layer, the first layer abutting the circumference 94 of the part. As shown, the circumference 94 is tapered towards the outside of the hearing aid housing so that the outer dimension of the part is slightly larger than the inner dimension of the part. Hereby, a light beam propagating vertically towards the part may impinge on every point on the circumference 94.

Figure 35:
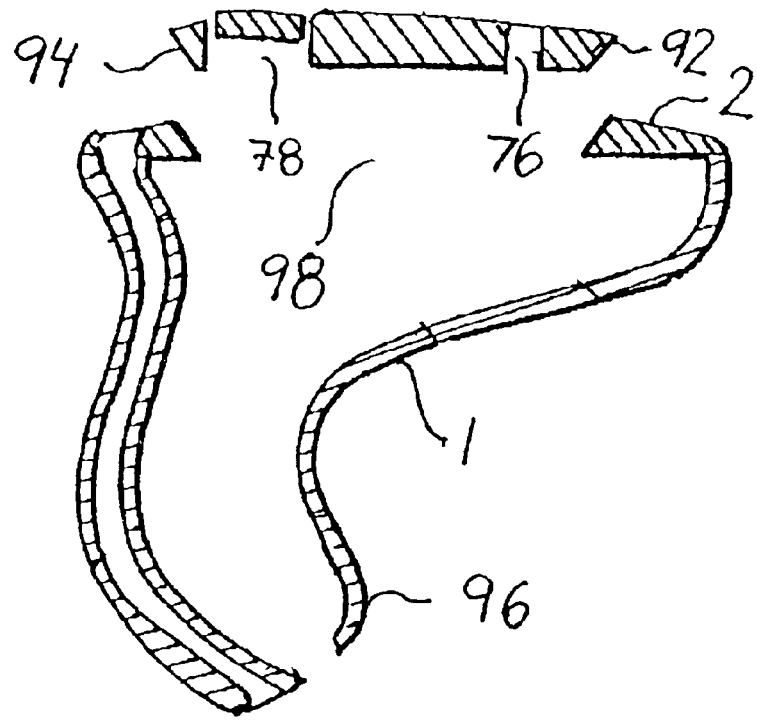
FIG. 35 shows a cross-section of a shell produced according to still another preferred embodiment of the invention.

Alternatively, the shell 1 may be formed starting with the end 96 opposing the face plate 2 as illustrated in FIG. 35. The integrated face plate 2 is terminated with an opening 98 having a circumference matching the circumference 94 of the separately produced part 92 of the face plate 2, the part 92 is positioned and fitted in the opening 98 for attachment to the integrated face plate 2. As illustrated, the integrated face plate 2 may be tapered so that a light beam propagating vertically towards the integrated face plate 2 may impinge on every point on the circumference of the integrated face plate 2.

Figure 36:
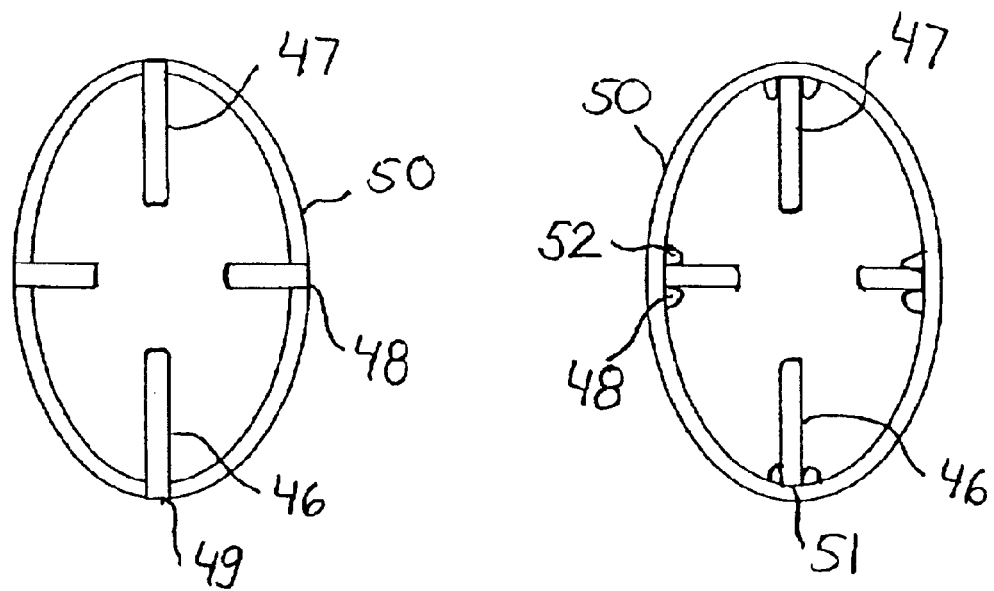
FIG. 36 shows various embodiments of a face plate.

FIG. 36 shows a cross-section of the shell opening covered by the face plate 2 seen from below the face plate 2. FIG. 36 illustrates various embodiments of the face plate positioning means 46 and mating shell positioning means 48. In FIG. 36(a), the face plate positioning means 46 have four ribs 47 extending from the circumference of the face plate 2 along the inner surface of the face plate 2 to the battery opening 73 (not shown). The shell positioning means 48 have mating indentations 49 that are adapted to receive and match the respective ribs 47 of the face plate 2. The face plate 2 is cut along the junction contour 50 so that it matches the junction contour when the ribs 47 are received by the mating indentations 49 of the shell 1 whereby correct assembly of the face plate 2 and the shell 1 is facilitated.

In FIG. 36(b), the face plate positioning means 46 have ribs 47 also extending along the inner surface of the face plate 2 and extending from the circumference 50 of the face plate at a distance from the circumference 50 that is substantially equal to the thickness of the shell at the junction contour 50. The shell positioning means 48 have comprise the shell 1 at the junction contour 50. The face plate 2 is cut along the junction contour 50 so that it matches the junction contour 50 when the ends of the ribs 47 abut the corresponding part 51 of the inner surface of the shell 1. The shell positioning means 48 may further comprise protrusions 52 at the junction contour 50 extending inwardly towards the interior of the shell 1 for reception and holding corresponding face plate ribs 47.

The design described above of the modular hearing aid according to the invention with the individually adapted shell 1, the face plate 2 fastened to the shell 1 and formed according to the shell contour, the battery lid 73 and its hinge connection with the socket of the electronic module 74 allows an extremely expedient and economic manufacturing together with a very compact design that allows manufacturing of individually adapted in-the-ear hearing aids of reduced dimensions.

What is claimed is:

1. A CAD/CAM system for design and manufacture of a hearing aid housing comprising a face plate and a shell that is matched to the auditory canal of a user, the system being adapted for reception and processing of data representing the shape of the auditory canal, formation of a three-dimensional model of the shell based on the data, and outputting of data representing the model for production of the shell and the face plate based on the model, said system being further adapted for selection of shape, dimension, and position of an acoustic output opening in the hearing aid shell for transmission of sound from the hearing aid towards the tympanic membrane, and inclusion of a model of the opening in the shell model.

2. A CAD/CAM system according to claim 1, further adapted for selection of a junction contour encircling the shell for positioning of a junction between the hearing aid shell and the face plate.

3. A CAD/CAM system according to claim 2, further adapted for inclusion of the junction contour in a face plate model, and for transfer of the data representing the model to a numerically controlled machine that automatically cuts a separately manufactured face plate along a contour that matches the junction contour.

4. A CAD/CAM system according to claim 2, further adapted for inclusion of positioning means in the shell model to engage with corresponding positioning means of the face plate so that the circumference of the produced face plate matches the junction contour of the produced shell when the face plate positioning means engage with the shell positioning means.

5. A CAD/CAM system according to claim 1, further adapted for formation of a three-dimensional model of the face plate that matches the shell at a selected junction contour encircling the shell, and for integration of the face plate model and the shell model into one three-dimensional model of the hearing aid housing so that a hearing aid housing with an integrated face plate may be produced based on the hearing aid housing model.

6. A CAD/CAM system according to claim 1, further adapted for selection of shape, dimensions, and position of at least one microphone opening in the face plate, and for inclusion of the at least one microphone opening in the face plate model.

7. A CAD/CAM system according to claim 1, further adapted for selection of shape, dimensions, and position of a battery opening in the face plate facilitating insertion and removal of a battery, and for inclusion of the battery opening in the face plate model.

8. A CAD/CAM system according to claim 7, wherein the battery opening is adapted for passage of a battery and an electronic module, and further adapted for including engaging means in the face plate model for receiving and removably holding a socket, the electronic module comprising the socket, at least one microphone, a signal processor, and a receiver.

9. A CAD/CAM system according to claim 8, further adapted for including engagement structure at the battery opening in the face plate model, said engagement structure comprising grooves, tracks and/or notches for engagement with co-operating socket engagement structure formed on the socket.

10. A CAD/CAM system according to claim 1, further adapted for selection of the position of the acoustic output opening so that the acoustic output opening emits sound in the direction of a longitudinal axis of the auditory canal thus, minimizing the risk of the acoustic output opening emitting sound towards a wall of the auditory canal or even being partially or entirely occluded by an auditory canal wall.

11. A CAD/CAM system according to claim 1, further adapted for including a pipe stub in the shell model centered around the output opening and extending inwardly in the shell model forming a bushing for insertion of an ear wax guard.

12. A CAD/CAM system according to claim 11, further adapted for including a recess in the shell model covering an area around the output opening and matching an abutment collar of the ear wax guard or, matching an abutment collar of a bushing to be inserted in the opening for reception and holding of the ear wax guard.

13. A CAD/CAM system according to claim 1, further adapted for selection of a tightening contour that extends along the surface of the shell at least partly encircling the shell.

14. A CAD/CAM system according to claim 13, further adapted for increasing the outer dimensions along the tightening contour thereby providing a tight seal against the auditory canal wall when the shell is inserted in the auditory canal.

15. A CAD/CAM system according to claim 13, further adapted for including a groove extending along the contour in the model having a cross-section with a shape and dimensions that match a desired tightening ring to be mounted in the produced shell.

16. A CAD/CAM system according to claim 13, further adapted for including a groove extending along the contour in the model for deposition of a material different from the material of the shell in the groove, the deposited material constituting a tightening ring.

17. A CAD/CAM system according to claim 13, further adapted for selecting positions of the tightening contour at positions corresponding to positions in the auditory canal at which the dynamic variations of the dimensions of the auditory canal exhibit the least variations whereby a secure and tight mounting of the shell in the auditory canal is provided independent of user activity.

18. A CAD/CAM system according to claim 1, further adapted for outputting the data to a remote site for production of the hearing aid housing.

19. A CAD/CAM system according to claim 1, further adapted for selectively increasing the outer dimensions of the hearing aid shell model so that the corresponding hearing aid shell exerts a pressure on the auditory canal tissue when the shell is inserted in the auditory canal.

20. A CAD/CAM system according to claim 19, further adapted for increasing the outer dimensions uniformly over the entire surface of the shell.

21. A CAD/CAM system according to claim 19, further adapted for reducing the increase of the outer dimensions gradually along the longitudinal axis of the shell so that very little or no pressure will be exerted on tissue residing deeply in the auditory canal.

22. A CAD/CAM system according to claim 1, further adapted for selecting three-dimensional models of shapes and geometries of various hearing aid components, such as microphones, signal processors, output transducers, from a database for incorporation into the hearing aid to be manufactured.

23. A CAD/CAM system according to claim 22, further adapted for positioning and displaying models of the selected components within the hearing aid housing model for selection of respective optimum positions, e.g. for provision of a hearing aid of a minimum size.

24. A CAD/CAM system according to claim 23, further adapted for performing collision checks.

25. A CAD/CAM system according to claim 24, further adapted for performing collision check during movement of a component in the shell along a desired path.

26. A CAD/CAM system according to claim 1, further adapted for selecting the path of the junction contour while the shell is displayed as inserted in the auditory canal for selection of optimum cosmetic appearance when the hearing aid is inserted in the auditory canal.

27. A CAD/CAM system according to claim 1, further adapted for smoothing the surface of the shell model to eliminate sharp edges and corners and to obtain a smooth surface.

28. A CAD/CAM system according to claim 27, further adapted for selecting specific areas of the shell, e.g. using a computer mouse with a cursor, for smoothing.

29. A CAD/CAM system according to claim 27, further adapted for removing an artifact from the hearing aid housing model by deleting the surface covered by the artifact from the model and calculating a new surface substituting the deleted surface based on the surface surrounding the artifact.

30. A CAD/CAM system according to claim 1, further adapted for storing the finished hearing aid housing model ready for use as a basis for production of a corresponding hearing aid housing in a database for later retrieval.

31. A CAD/CAM system according to claim 30, further adapted for utilizing the database for further automation of the design process.

32. A CAD/CAM system according to claim 31, wherein the models are stored in a reduced form requiring a reduced amount of data.

33. A CAD/CAM system according to claim 1, further adapted to receive the acquired data from a remote site for further processing.

34. A CAD/CAM system according to claim 1, further adapted to output data representing the model to an apparatus for production of the shell utilizing stereolithography.

35. A CAD/CAM system according to claim 1, further adapted to output data representing the model to an apparatus for production of the shell utilizing laser sintering.

36. A CAD/CAM system according to claim 1, further adapted to output data representing the model to an apparatus for production of the shell utilizing drop deposition printing.

37. A CAD/CAM system according to claim 1, further adapted to output data representing the model to an apparatus for production of a plurality of shells in one batch.

38. A CAD/CAM system according to claim 1, further adapted to output data representing the model to an apparatus for production of the shell starting at the corresponding face plate.

39. A CAD/CAM system according to claim 1, further adapted to output data representing the model to an apparatus for production of the shell with an integrated face plate, a part of the face plate including the battery opening being separately manufactured, the shell being produced starting where the integrated face plate abuts the separately manufactured part of the face plate.

40. A CAD/CAM system according to claim 39, wherein the circumference of the part of the face plate is tapered so that the outer dimension of the part is slightly larger than the inner dimension of the part whereby a light beam propagating vertically towards the part may impinge on every point of its circumference.

41. A CAD/CAM system according to claim 1, further adapted to output data representing the model to an apparatus for production of the shell with an integrated face plate, a part of the face plate including the battery opening being separately manufactured, the shell being produced starting with the end opposing the face plate and terminated with an outward opening in the integrated face plate having a circumference matching the circumference of the separately manufactured part of the face plate.

42. A CAD/CAM system according to claim 1, further adapted to include a model of receiver holders in the shell for receiving and holding the receiver.

43. A CAD/CAM system according to claim 42, wherein the receiver holders are automatically adapted to fit a selected receiver.

44. A CAD/CAM system for design and manufacture of a hearing aid housing comprising a face plate and a shell that is matched to the auditory canal of a user, the system being adapted for reception and processing of data representing the shape of the auditory canal, formation of a three-dimensional model of the shell based on the data, and outputting of data representing the model for production of the shell and the face plate based on the model, said system being further adapted for including a ventilation channel in the model.

45. A CAD/CAM system according to claim 44, further adapted for selection of a path along which the ventilation channel is intended to extend.

46. A CAD/CAM system according to claim 45, further adapted for determination of the position and the geometry of the ventilation channel opening in the face plate facilitating automatic production of the face plate with the ventilation channel opening.

47. A CAD/CAM system according to claim 46, farther adapted for selection of a position of an in-the-ear ventilation channel opening so that the ventilation channel opening points in the direction of a longitudinal axis of the auditory canal when the housing is inserted in the auditory canal.

48. A CAD/CAM system for design and manufacture of a hearing aid housing comprising a face plate and a shell that is matched to the auditory canal of a user, the system being adapted for reception and processing of data representing the shape of the auditory canal, formation of a three-dimensional model of the shell based on the data, and outputting of data representing the model for production of the shell and the face plate based on the model, said system being further adapted for forming an ear model of the auditory canal and a part of the outer ear based on the data.

49. A CAD/CAM system according to claim 48, further adapted for distinguishably displaying the ear model and the housing model.

50. A CAD/CAM system according to claim 49, further adapted for displaying the ear model transparently facilitating display of the shell as inserted in the auditory canal.

51. A CAD/CAM system for design and manufacture of a hearing aid housing comprising a face plate and a shell that is matched to the auditory canal of a user, the system being adapted for reception and processing of data representing the shape of the auditory canal, formation of a three-dimensional model of the shell based on the data, and outputting of data representing the model for production of the shell and the face plate based on the model, said system being further adapted for incorporating a serial number or another identification of the produced hearing aid housing into the housing model, e.g. in a selected position, so that the housing may be produced with an inherent identification.

52. A CAD/CAM system for design and manufacture of a hearing aid housing comprising a face plate and a shell that is matched to the auditory canal of a user, the system being adapted for reception and processing of data representing the shape of the auditory canal, formation of a three-dimensional model of the shell based on the data, and outputting of data representing the model for production of the shell and the face elate based on the model, said system being further adapted for forming a patient database comprising records with a patient identifier, e.g. name and number, holding the resulting hearing aid housing model of the patient in question.

53. A CAD/CAM system according to claim 52, wherein the records further hold respective models of the original impression of the auditory canal of the respective patients, and identifiers and models of the hearing aid components used in the respective patients' hearing aids.

* * * * *